(12) United States Patent
Long et al.

(10) Patent No.: US 11,955,080 B2
(45) Date of Patent: Apr. 9, 2024

(54) DISPLAY MODULE AND ELECTRONIC DEVICE

(71) Applicant: Huawei Technologies Co., Ltd., Shenzhen (CN)

(72) Inventors: Haohui Long, Beijing (CN); Xuan Cao, Shenzhen (CN); Runqing Ye, Shanghai (CN); Jianping Fang, Beijing (CN); Xiaochen Chen, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/007,259

(22) PCT Filed: Jul. 28, 2021

(86) PCT No.: PCT/CN2021/109048
§ 371 (c)(1),
(2) Date: Jan. 27, 2023

(87) PCT Pub. No.: WO2022/022595
PCT Pub. Date: Feb. 3, 2022

(65) Prior Publication Data
US 2023/0267883 A1    Aug. 24, 2023

(30) Foreign Application Priority Data

Jul. 30, 2020 (CN) .......................... 202010753480.4
Dec. 18, 2020 (CN) .......................... 202011507874.8

(51) Int. Cl.
*G09G 3/3233* (2016.01)
*G06V 40/13* (2022.01)
(Continued)

(52) U.S. Cl.
CPC ....... *G09G 3/3233* (2013.01); *G06V 40/1318* (2022.01); *G09G 3/035* (2020.08);
(Continued)

(58) Field of Classification Search
CPC .. H10K 59/00–95; G09G 3/2085; G09G 3/32; G06F 1/1626; G06F 1/1643;
(Continued)

(56) References Cited

U.S. PATENT DOCUMENTS

| | | |
|---|---|---|
| 2016/0012772 A1 | 1/2016 | White et al. |
| 2016/0351539 A1 | 12/2016 | Bower et al. |

(Continued)

FOREIGN PATENT DOCUMENTS

| | | | |
|---|---|---|---|
| CN | 101887889 A | | 11/2010 |
| CN | 201910207 U | * | 7/2011 |

(Continued)

*Primary Examiner* — Sanjiv D. Patel
(74) *Attorney, Agent, or Firm* — Slater Matsil, LLP

(57) ABSTRACT

A display module includes a circuit board, an integrated chip, and a pixel chipset. The integrated chip is electrically connected to the circuit board, and the integrated chip includes a first chiplet and a plurality of display pixel drive circuits integrated into the first chiplet. The pixel chipset includes a plurality of light-emitting chips. In addition, at least one pixel chipset is disposed on a surface of a side that is of an integrated chip and that is away from the circuit board, a light-emitting chip disposed on the integrated chip is electrically connected to a display pixel drive circuit in the integrated chip, and the display pixel drive circuit is configured to drive the light-emitting chip to emit light.

18 Claims, 22 Drawing Sheets

(51) Int. Cl.
*G09G 3/00* (2006.01)
*H10K 59/129* (2023.01)

(52) U.S. Cl.
CPC ... *H10K 59/129* (2023.02); *G09G 2300/0408* (2013.01); *G09G 2300/0452* (2013.01); *G09G 2330/02* (2013.01); *G09G 2354/00* (2013.01)

(58) Field of Classification Search
CPC ............... G06F 3/0488; G06F 3/0412; H05K 2201/10106; H05K 5/0086; H05K 2201/1003; G09F 9/301; G09F 13/22; G09F 9/30; G06V 40/1318; G06V 40/12; G06V 40/13
See application file for complete search history.

(56) References Cited

U.S. PATENT DOCUMENTS

| | | |
|---|---|---|
| 2018/0095502 A1 | 4/2018 | Yamazaki et al. |
| 2019/0013307 A1 | 1/2019 | Wu et al. |
| 2020/0035749 A1 | 1/2020 | Chen et al. |
| 2020/0161288 A1 | 5/2020 | Bibl et al. |

FOREIGN PATENT DOCUMENTS

| | | | |
|---|---|---|---|
| CN | 201910207 U | | 7/2011 |
| CN | 106409145 A | | 2/2017 |
| CN | 107466158 A | | 12/2017 |
| CN | 109802018 A | | 5/2019 |
| CN | 208888832 U | | 5/2019 |
| CN | 110472547 A | | 11/2019 |
| CN | 110520817 A | | 11/2019 |
| CN | 110600463 | * | 12/2019 |
| CN | 110600463 A | | 12/2019 |
| CN | 110675755 A | | 1/2020 |
| CN | 111210729 A | | 5/2020 |
| CN | 111341813 A | | 6/2020 |
| CN | 211088267 U | | 7/2020 |
| DE | 102009053064 A1 | | 5/2011 |
| KR | 20160052189 A | * | 5/2016 |
| WO | 2020147998 A1 | | 7/2020 |

* cited by examiner

DISPLAY MODULE AND ELECTRONIC DEVICE

CROSS-REFERENCE TO RELATED APPLICATIONS

This application is a national stage of International Application No. PCT/CN2021/109048, filed on Jul. 28, 2021, which claims priority to Chinese Patent Application No. 202010753480.4, filed on Jul. 30, 2020 and Chinese Patent Application No. 202011507874.8, filed on Dec. 18, 2020. All of the aforementioned applications are hereby incorporated by reference in their entireties.

TECHNICAL FIELD

This application relates to the field of display technologies, and in particular, to a display module and an electronic device.

BACKGROUND

Currently, an organic light-emitting diode (organic light-emitting diode, OLED) is disposed in a subpixel (subpixel) of a display module that can implement self-luminescence, for example, a display module that uses an active-matrix organic light-emitting diode (active-matrix organic light-emitting diode, AMOLED) technology. Grayscale display can be implemented by controlling brightness of different OLEDs. Therefore, a backlight module (backlight unit, BLU) configured to provide a backlight source does not need to be disposed, so that a thickness of the display module can be reduced.

As shown in FIG. 1, a thin film transistor (thin film transistor, TFT) backplane 10 and a printed circuit board (printed circuit board, PCB) configured to carry a control chip 11 are disposed in an AMOLED display module. A drive circuit mainly formed by the TIFT is disposed in the TFT backplane 10, and the drive circuit is configured to drive an OLED component located above the TFT backplane to emit light. However, due to existence of the TFT backplane 10 and the PCB, it is difficult to further reduce a thickness and a weight of the self-luminous display module, which is unfavorable to a lightening and thinning design of the display module.

SUMMARY

This application provides a display module and an electronic device, to resolve a problem of a large thickness and a heavy weight of a self-luminous display module.

To achieve the foregoing objective, the following technical solutions are used in this application.

According to an aspect of this application, a display module is provided. The display module includes a circuit board, an integrated chip, and a pixel chipset. The integrated chip is electrically connected to the circuit board, and the integrated chip includes a first chiplet and a plurality of display pixel drive circuits integrated into the first chiplet. The pixel chipset includes a plurality of light-emitting chips. In addition, at least one pixel chipset is disposed on a surface of a side that is of an integrated chip and that is away from the circuit board, a light-emitting chip disposed on the integrated chip is electrically connected to a display pixel drive circuit in the integrated chip, and the display pixel drive circuit is configured to drive the light-emitting chip to emit light. In this way, because the display pixel drive circuit configured to drive the light-emitting chip to emit light may be integrated into the first chiplet in the integrated chip, compared with a current AMOLED display module, the display module provided in this embodiment of this application does not need to be manufactured with a TFT backplane, so that a weight of the display module can be effectively reduced, and a thickness of the display module can be reduced.

Optionally, the display module further includes a circuit substrate. The circuit substrate is electrically connected to the circuit board, a plurality of display pixel drive circuits are integrated into the circuit substrate, and an area of a vertical projection of the circuit substrate on the circuit board is less than an area of a vertical projection of the integrated chip on the circuit board. The display module further includes two or more pixel chipsets. A pixel chipset is disposed on a surface of a side that is of a circuit substrate and that is away from the circuit board, and a light-emitting chip disposed on the circuit substrate is electrically connected to a display pixel circuit in the circuit substrate. Similarly, the display pixel drive circuit configured to drive the light-emitting chip to emit light is integrated into the circuit substrate, so that a weight of the display module can be effectively reduced, and a thickness of the display module can be reduced.

Optionally, the circuit board includes a main view region and a surrounding region located around the main view region. The integrated chip is disposed in the main view region, and the circuit substrate is disposed in the surrounding region. The surrounding region is located at the edge of the circuit board. A size of the integrated chip is large, and a contact area between the integrated chip and the circuit board is large. However, a size of the circuit substrate is small, and a contact area between the circuit substrate and the circuit board is small. In this case, in a transportation or use process of the display module, the surrounding region is prone to slightly deform under external force, for example, in a collision process. Therefore, the circuit substrate with the small size may be disposed in the surrounding region, and the integrated chip with the large size may be disposed in the main view region that is not prone to deformation. Therefore, when the display module is under external force, and a collision occurs in the surrounding region, the circuit substrate is not easily to crack. This helps improve product reliability.

Optionally, the display module further includes a rotating shaft, and the rotating shaft is disposed on a side that is of the circuit board and that is away from the integrated chip. The circuit board is a flexible circuit board, and the circuit board includes a first main view region, a second main view region, a first surrounding region, a second surrounding region, and a bending region, where the bending region is located between the first main view region and the second main view region, a vertical projection of the rotating shaft on the circuit board is located in the bending region, the first surrounding region is disposed around the first main view region, and the second surrounding region is disposed around the second main view region. The integrated chip is disposed in the first main view region and the second main view region; and a plurality of circuit substrates are disposed in the bending region, the first surrounding region, and the second surrounding region. It can be learned from the foregoing descriptions that the size of the integrated chip is large, and the contact area between the integrated chip and the circuit board is large. However, the size of the circuit substrate is small, and the contact area between the circuit substrate and the circuit board is small. The first surrounding region and the second surrounding region of the circuit board are located at the edge of the circuit board. In this case, in a transportation or use process of the display module, the first surrounding region and the second surrounding region are prone to slightly deform under external force, for example, in a collision process. Therefore, the circuit substrate with the small size may be disposed in the first surrounding region and the second surrounding region, and the integrated chip with the large size may be disposed in the main view region that is not prone to deformation. Therefore, when the display module is under external force, and a collision occurs in the first surrounding region and the second surrounding region, the circuit substrate is not easily to crack. This helps improve product reliability.

Optionally, the circuit board includes a plurality of metal cables, the plurality of metal cables are disposed in the bending region. The metal cable is in a curved shape, and two ends of the metal cable are respectively connected to two circuit substrates. In this way, because the metal cable has specific tensile performance, and can deform with bending of the bending region, stress generated at a location of the circuit substrate due to the deformation of the bending region is reduced, to further reduce a probability of a crack occurs in the circuit substrate.

Optionally, a plurality of circuit substrates in the bending region are arranged in a matrix form. The plurality of metal cables include a plurality of first metal cables and a plurality of second metal cables. The first metal cable is connected to two adjacent circuit substrates along a first direction, and the second metal cable is connected to two adjacent circuit substrates along a second direction. The first direction is perpendicular to the second direction. In this way, the plurality of first metal cables and the plurality of second metal cables may form a net structure to connect the plurality of circuit substrates in the bending region, so that resilience of the bending region can be improved, and a probability that a crack occurs in the circuit substrate can be further reduced.

Optionally, the plurality of light-emitting chips in the same pixel chipset include a first light-emitting chip, a second light-emitting chip, and a third light-emitting chip. The first light-emitting chip, the second light-emitting chip, and the third light-emitting chip are respectively configured to emit light of three primary colors. In this way, the first light-emitting chip, the second light-emitting chip, and the third light-emitting chip in the same pixel chipset may form a pixel. Respective brightness of the first light-emitting chip, the second light-emitting chip, and the third light-emitting chip in the same pixel chipset is adjusted, so that a pixel grayscale of an image can be displayed when the display module is controlled to perform color display.

Optionally, the integrated chip further includes a plurality of fingerprint pixel collection circuits integrated into the first chiplet. The pixel chipset further includes a fingerprint collection chip. A fingerprint collection chip disposed on the integrated chip is electrically connected to a fingerprint pixel collection circuit in the integrated chip, and the fingerprint pixel collection circuit is configured to drive the fingerprint collection chip to perform fingerprint collection. A plurality of fingerprint collection chips in different pixel chipsets form a fingerprint collector. In this way, the fingerprint collector does not need to be independently disposed on the circuit board, but collection pixels of the fingerprint collector are integrated into each pixel chipset, to help improve integration of the display module.

Optionally, the integrated chip further includes a plurality of fingerprint pixel collection circuits integrated into the first chiplet, and a fingerprint pixel collection circuit is further integrated into the circuit substrate. The pixel chipset further includes a fingerprint collection chip. A fingerprint collection chip disposed on the integrated chip is electrically connected to a fingerprint pixel collection circuit in the integrated chip, the fingerprint collection chip disposed on the circuit substrate is electrically connected to the fingerprint pixel collection circuit in the circuit substrate. The fingerprint pixel collection circuit is configured to drive the fingerprint collection chip to perform fingerprint collection. A plurality of fingerprint collection chips in different pixel chipsets form a fingerprint collector. In this way, collection pixels of the fingerprint collector are disposed in each of the pixel chipset on the integrated chip and the pixel chipset on the circuit substrate, to help improve fingerprint collection precision. In addition, technical effects of the fingerprint collection chip and the fingerprint pixel collection circuit are the same as those described above. Details are not described herein again.

Optionally, the integrated chip further includes a plurality of light-emitting pixel drive circuits and a plurality of light-receiving pixel drive circuits that are integrated into the first chiplet. The pixel chipset further includes a light-emitting chip and a light-receiving chip. A light-emitting chip disposed on the integrated chip is electrically connected to a light-emitting pixel drive circuit in the integrated chip, and light-receiving chip is electrically connected to a light-receiving pixel drive circuit in the integrated chip. The light-emitting pixel drive circuit is configured to drive the light-emitting chip to emit light, and the light-receiving pixel drive circuit is configured to drive the light-receiving chip to receive light. A plurality of light-emitting chips in different pixel chipsets form a light emitter, and a plurality of light-receiving chips in different pixel chipsets form a light receiver. Therefore, the light emitter does not need to be independently disposed on the circuit board, but pixels of the light emitter are integrated into each pixel chipset, to help improve integration of the display module. Therefore, the light receiver does not need to be independently disposed on the circuit board, but pixels of the light receiver are integrated into each pixel chipset, to help improve integration of the display module.

Optionally, the integrated chip further includes a plurality of light-emitting pixel drive circuits and a plurality of light-receiving pixel drive circuits that are integrated into the first chiplet. A light-emitting pixel drive circuit and a light-receiving pixel drive circuit are further integrated into the circuit substrate. The pixel chipset further includes a light-emitting chip and a light-receiving chip. A light-emitting chip disposed on the integrated chip is electrically connected to a light-emitting pixel drive circuit in the integrated chip, and a light-receiving chip is electrically connected to a light-receiving pixel drive circuit in the integrated chip. A light-emitting chip disposed on the circuit substrate is electrically connected to a light-emitting pixel drive circuit in the circuit substrate, and a light-receiving chip is electrically connected to a light-receiving pixel drive circuit in the circuit substrate. The light-emitting pixel drive circuit is configured to drive the light-emitting chip to emit light, and the light-receiving pixel drive circuit is configured to drive the light-receiving chip to receive light. A plurality of light-emitting chips in different pixel chipsets form a light emitter, and a plurality of light-receiving chips in different pixel chipsets form a light receiver. In this way, pixels of the light emitter and the light receiver are disposed in each of the pixel chipset on the integrated chip and the pixel chipset on the circuit substrate, to help improve fingerprint collection precision. In addition, technical effects of the light-emitting chip, the light-receiving chip, and the light-emitting pixel drive circuit are the same as those described above. Details are not described herein again.

Optionally, the first chiplet includes a system-on-a-chip, a power management unit, a central processing unit, an image processor, or a storage chip. A type of the first chiplet in different integrated chips may be different, so that more chips can be integrated.

Optionally, the integrated chip further includes a second chiplet. The second chiplet and the first chiplet are disposed in a stacked manner, and the second chiplet is located on a side that is of the first chiplet and that is close to the circuit board. The second chiplet includes a system-on-a-chip, a power management unit, a central processing unit, or an image processor, and the first chiplet includes a storage chip. In this way, the first chiplet and the second chiplet are stacked to form the integrated chip, so that component space in the display module can be further saved.

Optionally, the circuit board is a flexible circuit board. The circuit board includes a first part and a second part connected to the first part. A vertical projection of the pixel chipset on the circuit board is located in the first part, and the second part is bent on a side that is of the first part and that is away from the pixel chipset. The display module further includes an additional electronic component, and the additional electronic component is disposed on a surface that is of the second part and that is close to the first part, and is electrically connected to the circuit board. In this way, more electronic components can be integrated into the display module, to improve integration of the display module.

Optionally, the display module further includes an interposer. The interposer is electrically connected to the circuit board, at least two integrated chips are disposed on a surface of a side that is of the interposer and that is away from the circuit board, and are electrically connected through the interposer. A circuit configured to implement mutual communication between the at least two integrated chips may be formed in the interposer. In this way, circuit structures interconnected between all integrated circuits do not need to be manufactured in the circuit board, so that space for arranging circuits in the circuit board can be saved.

Optionally, the circuit substrate further includes a substrate body and a redistribution layer that are sequentially away from the circuit board, a transistor of the display pixel drive circuit is integrated into the substrate body, and a cable in the display pixel drive circuit is integrated into the redistribution layer. A material of the substrate body includes monocrystalline silicon. In this way, the transistors configured to form the display pixel circuit may be formed on a silicon substrate by using the CMOS process. Then, the redistribution layer is manufactured on a side that is of the substrate body on which the transistors are manufactured and that is away from the circuit board. The transistors in the substrate body are interconnected based on a design requirement by using metal cables at the redistribution layer, to form the display pixel drive circuit.

Optionally, the display module further includes a packaging layer, the packaging layer is located on a side that is of the pixel chipset and that is away from the circuit board, and covers the integrated chip and the pixel chipset. The packaging layer is configured to protect the integrated chip and the pixel chipset, to prevent the integrated chip and the pixel chip from being eroded by water and oxygen.

Optionally, the display module further includes a cover, the cover covers a surface of a side that is of the packaging layer and that is away from the circuit board, and is connected to the packaging layer, to protect the packaging layer.

Optionally, the display module further includes a heat dissipation layer, the heat dissipation layer covers a surface of a side that is of the circuit board and that is away from the pixel chipset, and is connected to the circuit board. In this way, the heat dissipation layer can transfer heat generated by the display module and heat generated by a battery to other components, for example, a housing of the display module. In this way, because the housing is in contact with air, heat inside the display module can be transferred to the outside of the display module, to dissipate heat.

According to another aspect of this application, an electronic device is provided, including a battery and any display module described above. The battery is located on a side that is of the circuit board and that is away from the pixel chipset. The battery is configured to supply power to the display module. The electronic device has a same technical effect as the display module provided in the foregoing embodiment. Details are not described herein again.

According to another aspect of this application, a display module is provided, including a circuit board, a circuit substrate, and a pixel chipset. The circuit substrate is electrically connected to the circuit board, and a plurality of display pixel drive circuits are integrated into the circuit substrate. The pixel chipset includes a plurality of light-emitting chips. A pixel chipset is disposed on a surface of a side that is of a circuit substrate and that is away from the circuit board; a light-emitting chip disposed on the circuit substrate is electrically connected to a display pixel circuit in the circuit substrate, and the display pixel drive circuit is configured to drive the light-emitting chip to emit light. The display module has a same technical effect as the display module provided in the foregoing embodiment. Details are not described herein again.

Optionally, the display module further includes a rotating shaft, and the rotating shaft is disposed on a side that is of the circuit board and that is away from the circuit substrate. The circuit board is a flexible circuit board, and the circuit board includes a first region, a second region, and a bending region located between the first region and the second region. A vertical projection of the rotating shaft on the flexible circuit board is located in the bending region. The circuit board includes a plurality of metal cables, the plurality of metal cables are disposed in the bending region, the metal cable is in a curved shape, and two ends of the metal cable are respectively connected to two circuit substrates. A technical effect of the metal cable is the same as that described above. Details are not described herein again.

Optionally, a plurality of circuit substrates in the bending region are arranged in a matrix form. The plurality of metal cables include a plurality of first metal cables and a plurality of second metal cables. The first metal cable is connected to two adjacent circuit substrates along a first direction, and the second metal cable is connected to two adjacent circuit substrates along a second direction, where the first direction is perpendicular to the second direction. Technical effects of the first metal cable and the plurality of second metal cables are the same as those described above. Details are not described herein again.

Optionally, the plurality of light-emitting chips in the same pixel chipset include a first light-emitting chip, a second light-emitting chip, and a third light-emitting chip. The first light-emitting chip, the second light-emitting chip, and the third light-emitting chip are respectively configured to emit light of three primary colors. Technical effects of the first light-emitting chip, the second light-emitting chip, and the third light-emitting chip are the same as those described above. Details are not described herein again.

Optionally, a fingerprint pixel collection circuit is further integrated into the circuit substrate. The pixel chipset further includes a fingerprint collection chip. A fingerprint collection chip disposed on the circuit substrate is electrically connected to a fingerprint pixel collection circuit in the circuit substrate. The fingerprint pixel collection circuit is configured to drive the fingerprint collection chip to perform fingerprint collection. A plurality of fingerprint collection chips in different pixel chipsets form a fingerprint collector. Technical effects of the fingerprint collection chip and the fingerprint pixel collection circuit are the same as those described above. Details are not described herein again.

Optionally, a light-emitting pixel drive circuit and a light-receiving pixel drive circuit are further integrated into the circuit substrate. The pixel chipset further includes a light-emitting chip and a light-receiving chip. A light-emitting chip disposed on the circuit substrate is electrically connected to a light-emitting pixel drive circuit in the circuit substrate, and a light-receiving chip is electrically connected to a light-receiving pixel drive circuit in the circuit substrate. The light-emitting pixel drive circuit is configured to drive the light-emitting chip to emit light, and the light-receiving pixel drive circuit is configured to drive the light-receiving chip to receive light. A plurality of light-emitting chips in different pixel chipsets form a light emitter, and a plurality of light-receiving chips in different pixel chipsets form a light receiver. Technical effects of the light-emitting pixel drive circuit, the light-receiving pixel drive circuit, the light-emitting chip, and the light-receiving chip are the same as those described above. Details are not described herein again.

Optionally, the circuit substrate further includes a substrate body and a redistribution layer that are sequentially away from the circuit board, a transistor of the display pixel drive circuit is integrated into the substrate body, and a cable in the display pixel drive circuit is integrated into the redistribution layer. A material of the substrate body includes monocrystalline silicon. Technical effects of the substrate body and the redistribution layer are the same as those described above. Details are not described herein again.

Optionally, the circuit board is a flexible circuit board. The circuit board includes a first part and a second part connected to the first part, and a plurality of circuit substrates are disposed in the first part. The second part is bent on a side that is of the first part and that is away from the circuit substrate. The display module further includes an additional electronic component, and the additional electronic component is disposed on a surface that is of the second part and that is close to the first part, and is electrically connected to the circuit board. Technical effects of the first part and the second part of the circuit board, and the additional electronic component are the same as those described above. Details are not described herein again.

According to another aspect of this application, an electronic device is provided, including a battery and any display module described above. The battery is located on a side that is of the circuit board and that is away from the pixel chipset. The battery is configured to supply power to the display module. The electronic device has a same technical effect as the display module provided in the foregoing embodiment. Details are not described herein again.

REFERENCE NUMERALS

10: TFT backplane; ii: Control chip; 02: Electronic device; 01: Display module; 13: Battery; 14: Circuit board; 20: Integrated chip; 201: First chiplet; 30: Circuit substrate; 40: Pixel chipset; 202: Second chiplet; 401: Light-emitting chip; 401a: First light-emitting chip; 401b: Second light-emitting chip; 401c: Third light-emitting chip; 100: Display pixel drive circuit; 301: Substrate body; 101: Fingerprint pixel collection circuit; 402: Fingerprint collection chip; 102: Light-emitting pixel drive circuit; 103: Light-receiving pixel drive circuit; 403: Light-emitting chip; 404: Light-receiving chip; 200: Wafer; 60: Soldering pad; 51: Light emitter; 52: Light receiver; 15: Rotating shaft; 140a: First main view region; 140b: Second main view region; 141a: First surrounding region; 141b: Second surrounding region; 141c: Bending region; 80: Interposer; 81: Solder ball; 61: Metal cable; 61a: First metal cable; 61b: Second metal cable; 71: Packaging layer; 72: Cover; 73: Heat dissipation layer; 142: First part; 143: Second part; 203: Additional electronic component; 151: First region; 152: Second region.

DETAILED DESCRIPTION OF ILLUSTRATIVE EMBODIMENTS

The following describes technical solutions in embodiments of this application with reference to accompanying drawings in embodiments of this application. It is clear that the described embodiments are merely a part rather than all of embodiments of this application.

Terms such as "first" and "second" mentioned below are merely intended for a purpose of description, and shall not be understood as an indication or implication of relative importance or implicit indication of a quantity of indicated technical features. Therefore, a feature limited by "first" or "second" may explicitly or implicitly include one or more features.

In addition, in this application, orientation terms such as "left" and "right" may include but are not limited to orientations of schematically placed components in relative accompanying drawings. It should be understood that these orientation terms may be relative concepts. The orientation terms are used for relative description and clarification, and may vary correspondingly based on a change in an orientation in which the component is placed in the accompanying drawings.

In this application, it should be noted that a term "connection" should be understood in a broad sense unless otherwise expressly specified and limited. For example, the "connection" may be a fixed connection, may be a detachable connection, may be an integral connection; may be a direct connection, or may be an indirect connection implemented by using a medium. In addition, the term "electrical connection" may be a direct electrical connection, or may be an indirect electrical connection through an intermediate medium.

Figure 1:
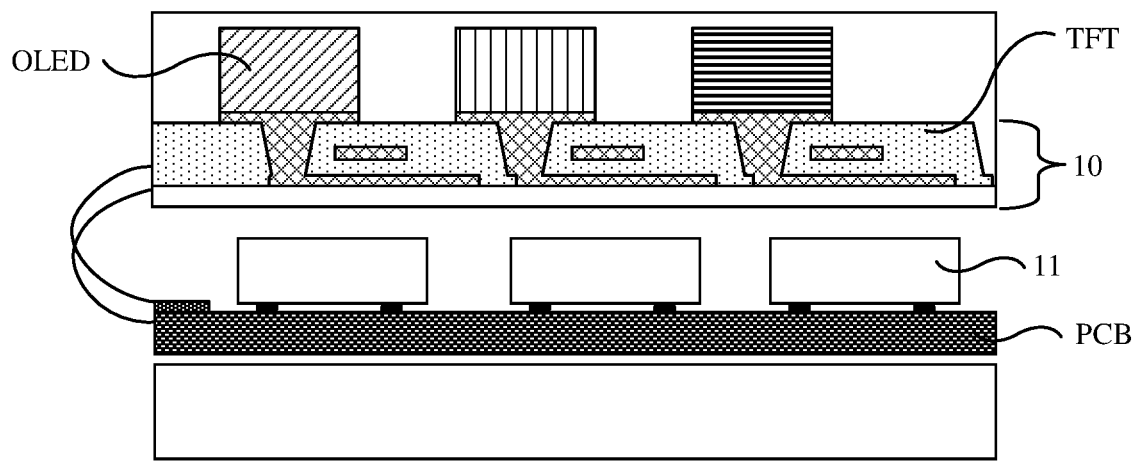
FIG. 1 is a schematic diagram of a structure of an AMOLED electronic device according to the conventional technology.
Figure 2:
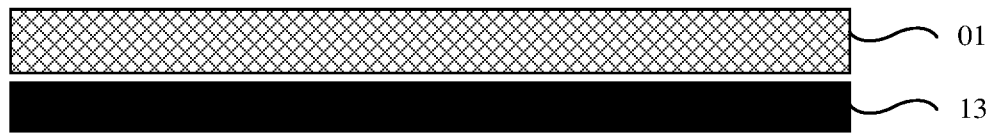
FIG. 2 is a schematic diagram of a structure of an electronic device according to an embodiment of this application.

An embodiment of this application provides an electronic device. The electronic device may include an electronic device that has a display function, such as a mobile phone (mobile phone), a tablet computer (pad), a television, an intelligent wearable product (for example, a smartwatch or a smart band), a virtual reality (virtual reality, VR) terminal device, and an augmented reality (augmented reality AR) terminal device. A specific form of the electronic device is not particularly limited in this embodiment of this application. For ease of description, an example in which an electronic device 02 is a mobile phone shown in FIG. 2 is used below for description. The electronic device 02 may include a display module 01 configured to display an image, and a battery 13 located on the back of the display module 01. The battery 13 is configured to supply power to the display module 01. The following describes a structure of the display module 01 in detail by using different examples.

Example 1

Figure 3A:
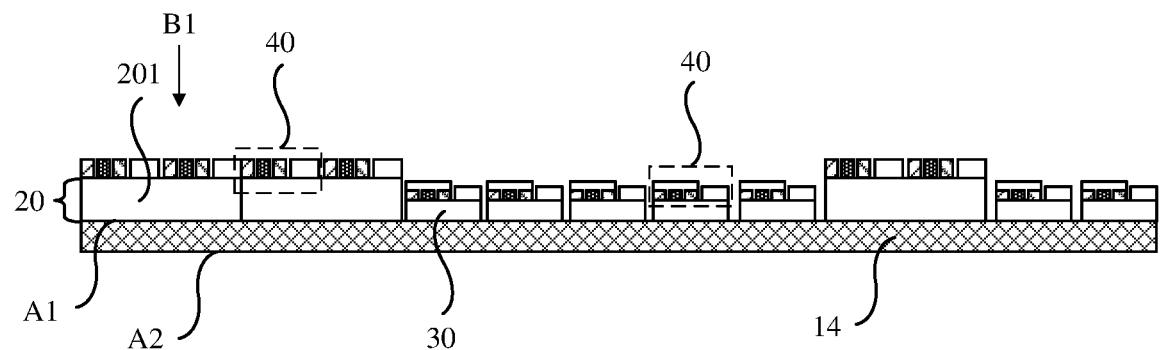
FIG. 3A is a schematic diagram of a structure of the display module in FIG. 2.

In this example, the display module 01 in the electronic device 02, as shown in FIG. 3A, may include a circuit board 14. The circuit board 14 may have a first surface A1 and a second surface A2 that are disposed opposite to each other. Based on this, the display module 01 may further include an integrated chip 20 and a circuit substrate 30 that are disposed on the first surface A1 of the circuit board 14 and that are electrically connected to the circuit board 14. Descriptions are provided in this application by using an example in which the display module 01 includes two or more (briefly referred to as a plurality of below) integrated chips 20 and a plurality of circuit substrates 30.

Figure 3B:
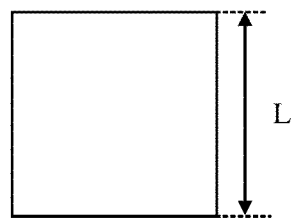
FIG. 3B is a schematic diagram of a structure of the integrated chip in FIG. 3A.

In some embodiments of this application, as shown in FIG. 3A, the integrated chip 20 may include a first chiplet (chiplet) 201. As shown in FIG. 3B (a top view obtained along an arrow B1 in FIG. 3A), a cross section (parallel to the first surface A1) of the first chiplet 201 may be a rectangle, and a size L of any side of the rectangle (referred to as a single-side size) may be at a millimeter level.

For example, the first chiplet 201 may be a system-on-a-chip (a system-on-a-chip, SoC), a power management unit (power management unit, PMU), a graphics processing unit (graphics processing unit, GPU), or a central processing unit (central processing unit, CPU). Alternatively, the first chiplet 201 may be a storage chip, for example, a universal flash storage (universal flash storage, UFS) or a double data rate (double data rate, DDR) memory. First chiplets 201 in different integrated chips 20 may be different. The first chiplet 201 may be a die (die), or may be a chip package structure obtained after the die is packaged.

Figure 4:
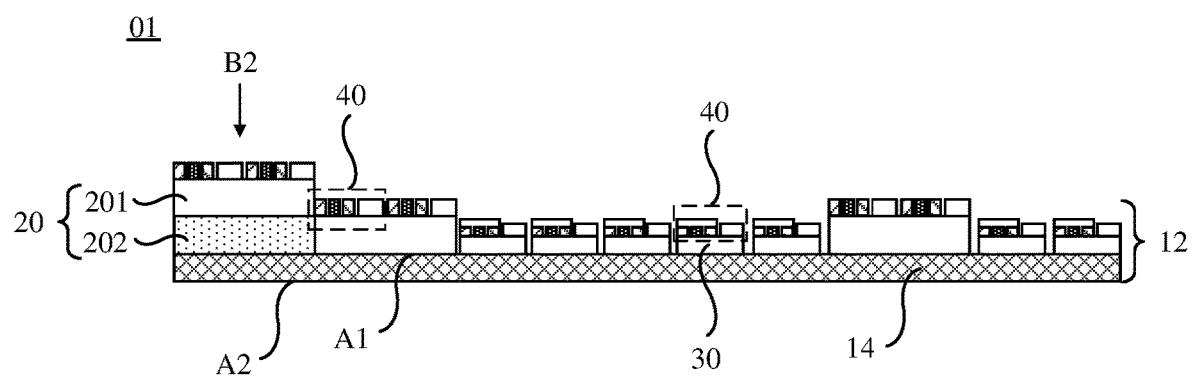
FIG. 4 is a schematic diagram of a structure of another display module according to an embodiment of this application.

Alternatively, in some other embodiments of this application, as shown in FIG. 4, the integrated chip 20 may include a first chiplet 201 and a second chiplet 202. The second chiplet 202 and the first chiplet 201 are disposed in a stacked manner. For example, the second chiplet 202 may be located on a side that is of the first chiplet 201 and that is close to the circuit board 14. In this case, the second chiplet 202 may be directly electrically connected to the circuit board 14, and the first chiplet 201 may use a flip chip bonding (flip chip bonding) process, so that a front side of a circuit structure in the first chiplet 201 faces a surface of a side that is of the second chiplet 202 and that is away from the circuit board 14. In addition, the first chiplet 201 may be indirectly electrically connected to the circuit board 14 through a through silicon via (through silicon via, TSV) that penetrates the second chiplet 202. Similarly, a single-side size of the second chiplet 202 may be at a millimeter level.

For example, the second chiplet 202 may include an SoC, a PMU, a CPU, or a GPU. The first chiplet 201 may include a UFS or a DDR. Alternatively, for another example, the first chiplet 201 may include an SoC, a PMU, a CPU, or a GPU. The second chiplet 202 may include a UFS or a DDR.

Based on this, the display module 01 may further include a plurality of pixel chipsets 40 shown in FIG. 4. In the plurality of pixel chipsets 40, at least one pixel chipset 40 is disposed on a surface of a side that is of an integrated chip 20 and that is away from the circuit board 14. For example, a plurality of pixel chipsets 40 shown in FIG. 5A (a top view obtained along an arrow B2 in FIG. 4) may be disposed on a surface of a side that is of an integrated chip 20 and that is away from the circuit board 14.

For example, the pixel driving group 40 may be a minimum repetition unit of a component that is of the display module 01 and that is configured to implement a display function. In this case, each pixel chipset 40 may include a plurality of light-emitting chips 401. The light-emitting chip 401 refers to dies that are arranged in an array on a wafer (wafer) by using a semiconductor chip preparation process, and each die has a light-emitting layer. Then, the wafer on which the dies are formed is cut, so that the dies are independent of each other. Each independent die after cutting is used as the light-emitting chip 401, and an edge formed after the die is cut is used as a boundary of the light-emitting chip 401. In some embodiments of this application, the light-emitting chip 401 may be a micro (micro) light-emitting diode (light-emitting diode, LED) with a die size of dozens of micrometers, or a mini (mini) LED with a die size of more than 100 micrometers. The light-emitting chip 401 is a current drive component. In this case, each light-emitting chip 401 may be used as a subpixel (subpixel) of the display module 01, and a plurality of light-emitting chips 404 in a same pixel chipset 40 may emit at least light of three primary colors. In this case, the pixel chipset 40 may be used as a pixel (pixel) of the display module 01, so that the display module 01 can display an image.

It can be learned from the foregoing descriptions that the single-side size of the first chiplet 201 or the second chiplet 202 in the integrated chip 20 may be at the millimeter level, for example, about 10 mm. For ease of description below, the integrated chip 20 and the plurality of pixel chipsets 40 disposed on the integrated chip 20 may be referred to as a millimeter-level display chiplet unit (display chiplet unit, DCU) 100.

Figure 5A:
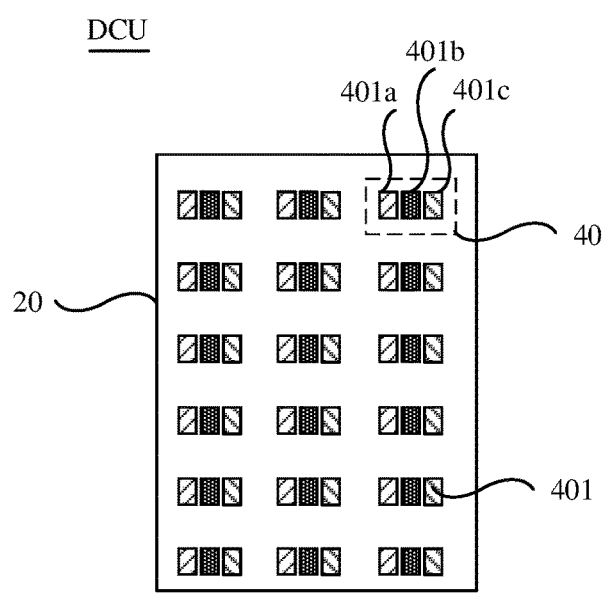
FIG. 5A is a schematic diagram of a structure of a DCU according to an embodiment of this application.

In some embodiments of this application, as shown in FIG. 5A, the plurality of light-emitting chips in the same pixel chipset 40 may include a first light-emitting chip 401a, a second light-emitting chip 401b, and a third light-emitting chip 401c. The first light-emitting chip 401a, the second light-emitting chip 401b, and the third light-emitting chip 401c may be respectively configured to emit light of the three primary colors. For example, the first light-emitting chip 401a, the second light-emitting chip 401b, and the third light-emitting chip 401c may be respectively configured to emit red (red, R) light, blue (blue, B) light, and green (Green, G) light. In this way, the first light-emitting chip 401a, the second light-emitting chip 401b, and the third light-emitting chip 401c in the same pixel chipset 40 may form a pixel (pixel). Respective brightness of the first light-emitting chip 401a, the second light-emitting chip 401b, and the third light-emitting chip 401c in the same pixel chipset 40 is adjusted, so that a pixel grayscale of an image can be displayed when the display module 01 is controlled to perform color display.

Figure 5B:
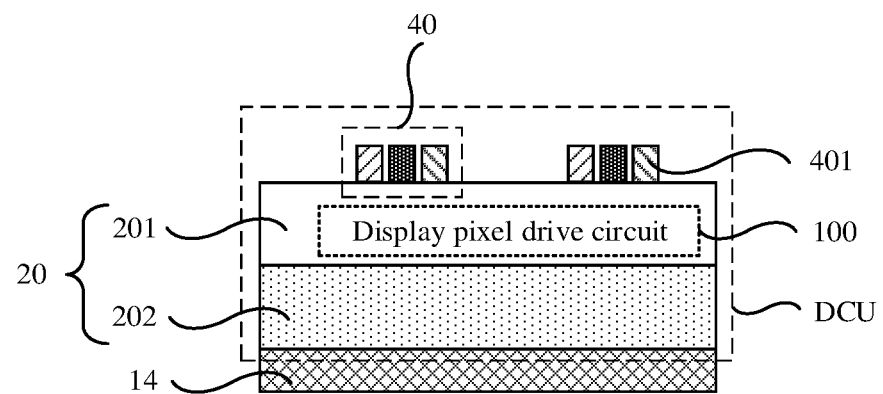
FIG. 5B is a schematic diagram of another structure of a DCU according to an embodiment of this application.

Based on this, to drive the light-emitting chip 401 disposed on the integrated chip 20 to emit light, as shown in FIG. 5B, the integrated chip 20 further includes a plurality of display pixel drive circuits 100 integrated into the first chiplet 201. For example, in a process of manufacturing the first chiplet 201 (for example, an SoC, a PMU, a CPU, a GPU, a UFS, or a DDR) by using a complementary metal-oxide-semiconductor (complementary metal-oxide-semiconductor, CMOS) process, the display pixel drive circuit 100 may be integrated into the first chiplet 201. In this case, a light-emitting chip 401 disposed on the integrated chip 20 may be electrically connected to a display pixel drive circuit 100 in the integrated chip 20. The display pixel drive circuit 100 is configured to drive the light-emitting chip 401 to emit light.

It should be noted that the display pixel drive circuit 100 may include a plurality of transistors formed by using the CMOS process. The display pixel drive circuit 100 may include a drive transistor and a plurality of switch transistors. A data voltage related to display data may be written to the drive transistor by controlling the switch transistor to be on and off. The drive transistor may generate, based on the data voltage, a drive current that matches the data voltage. Because the light-emitting chip 401 is the current drive component, when the drive current flows through the light-emitting chip 401, the light-emitting chip 401 may be driven to emit light. Brightness of the light-emitting chip 401 may be controlled by controlling a magnitude of the drive current. A connection manner of the plurality of transistors in the display pixel drive circuit 100 is not limited in this application, provided that the light-emitting chip 401 electrically connected to the display pixel drive circuit 100 can be driven to emit light.

In addition, when the integrated chip 20 has a chiplet, for example, the first chiplet 201, and when the integrated chip 20 includes the first chiplet 201 and the second chiplet 202 that are disposed in the stacked manner, the first chiplet 201 is in direct contact with the pixel chipset 40. In this case, to minimize a signal transmission distance between the display pixel drive circuit 100 and the light-emitting component 401 disposed on the integrated chip 20, and improve signal transmission efficiency, the foregoing descriptions are provided by using an example in which the display pixel drive circuit 100 is integrated into the first chiplet 201.

Alternatively, in some other embodiments of this application, when the integrated chip 20 includes the first chiplet 201 and the second chiplet 202 that are disposed in the stacked manner, the display pixel drive circuit 100 may be further integrated into the second chiplet 202. In this case, the light-emitting component 401 disposed on the integrated chip 20 may be indirectly electrically connected to the display pixel drive circuit 100 integrated into the second chiplet 202 through the first chiplet 201.

Figure 6A:
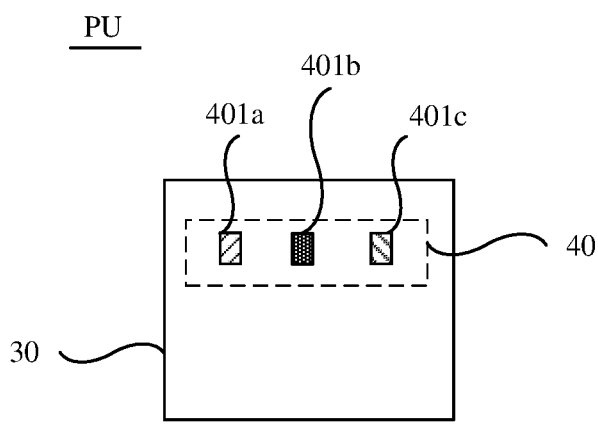
FIG. 6A is a schematic diagram of a structure of a PU according to an embodiment of this application.

Based on this, as shown in FIG. 4, in the plurality of pixel chipsets 40 in the display module 01, a pixel chipset 40 is disposed on a surface of a side that is of a circuit substrate 30 and that is away from the circuit board 14. That is, as shown in FIG. 6A, a pixel chipset 40 is disposed on a circuit substrate 30. A structure of the pixel chipset 40 is the same as that described above, and may include the first light-emitting chip 401a, the second light-emitting chip 401b, and the third light-emitting chip 401c.

Figure 6B:
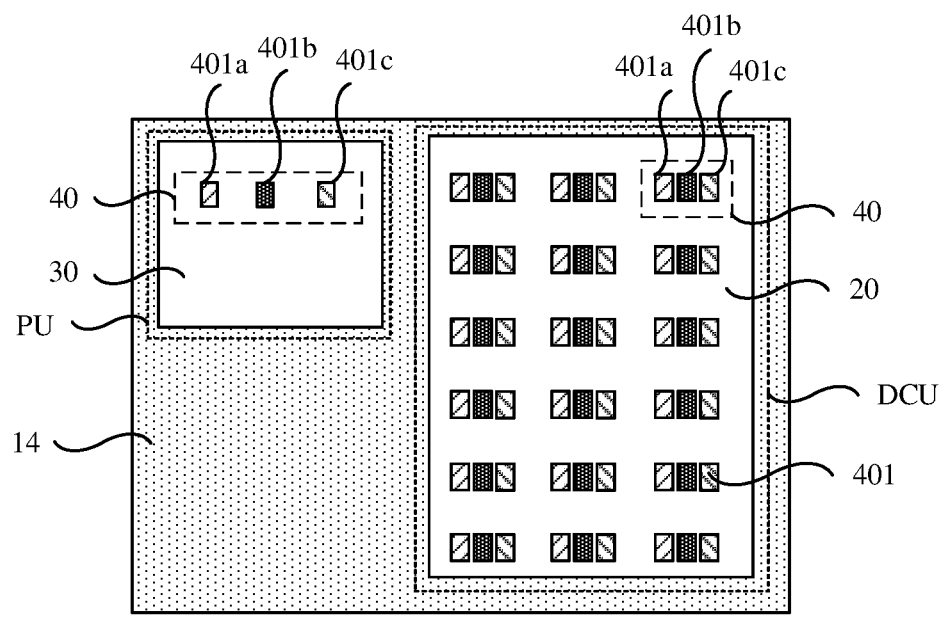
FIG. 6B is a schematic diagram of a structure of a DCU and a PU according to an embodiment of this application.

As shown in FIG. 6B, an area of a vertical projection of the circuit substrate 30 on the circuit board 14 (as shown in FIG. 4) is less than an area of a vertical projection of the integrated chip 20 on the circuit board 14. For example, a single-side size of the circuit substrate 30 may be at a micrometer level, for example, about 60 μm. Therefore, for ease of description, the circuit substrate 30 and a pixel chipset 40 disposed on the circuit substrate 30 may be referred to as a micrometer-level pixel integration unit (pixel unit, PU) below.

Figure 6C:
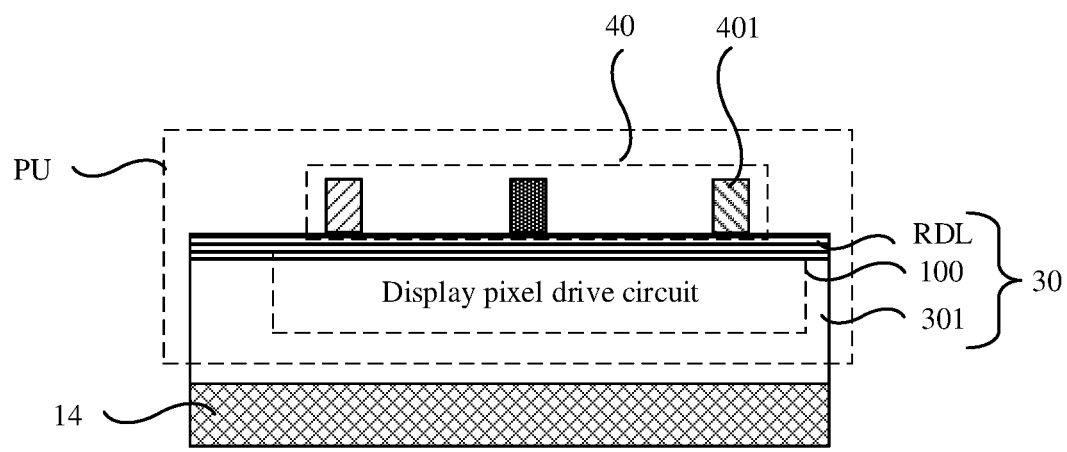
FIG. 6C is a schematic diagram of another structure of a PU according to an embodiment of this application.

Based on this, to drive the light-emitting chip disposed on the circuit substrate 30 to emit light, as shown in FIG. 6C, the circuit substrate 30 may include a plurality of display pixel drive circuits 100. In some embodiments of this application, the circuit substrate 30 may further include a substrate body 301 and a redistribution layer (redistribution layer, RDL) that are sequentially away from the circuit board 14. A material of the substrate body 301 may be monocrystalline silicon. In this case, the substrate body 301 may be referred to as a silicon substrate.

In this way, the transistor configured to form the display pixel drive circuit 100 may be formed in the silicon substrate by using the CMOS process. Then, the RDL is manufactured on a side that is of the substrate body 301 on which the transistors are manufactured and that is away from the circuit board 14. The transistors in the substrate body 301 are interconnected based on a design requirement by using metal cables at the RDL, to form the display pixel drive circuit 100. In this case, the transistor of the display pixel drive circuit 100 is integrated into the substrate body 301, and a cable in the display pixel drive circuit 100 is integrated into the RDL. In this case, a light-emitting chip 401 disposed on the circuit substrate 30 may be electrically connected to a display pixel circuit 100 in the circuit substrate 30, to emit light under a driving effect of the display pixel drive circuit 100.

In conclusion, the display module 01 provided in this embodiment of this application includes the circuit board 14, and a plurality of DCUs and a plurality of PUs that are disposed on a same side of the circuit board 14. As shown in FIG. 5B, the DCU includes the integrated chip 20 electrically connected to the circuit board 14, and the pixel chipset 40 disposed on the side that is of the integrated chip 20 and that is away from the circuit board 14. The plurality of light-emitting chips 401 are disposed in the pixel chipset 40. Each light-emitting chip 401 is electrically connected to a display pixel drive circuit 100 in the first chiplet 201 integrated into the integrated chip 20. In addition, as shown in FIG. 6B, the PU includes the circuit substrate 30 electrically connected to the circuit board 14, and the pixel chipset 40 disposed on the side that is of the circuit substrate 30 and that is away from the circuit board 14. The plurality of light-emitting chips 401 are also disposed in the pixel chipset 40. A light-emitting chip 401 disposed on the circuit substrate 30 is electrically connected to a display pixel drive circuit 100 integrated into in the circuit substrate 30. The display pixel drive circuit 100 may drive the light-emitting chip 401 electrically connected to the display pixel drive circuit 100 to emit light. Each light-emitting chip 401 may be used as a subpixel of the display module 01, so that the entire display module 01 can implement image display.

In this way, on the one hand, because the display pixel drive circuit 100 configured to drive the light-emitting chip 401 to emit light may be integrated into the first chiplet 201 in the DCU and the circuit substrate 30 in the PU, compared with a current AMOLED display module, the display module 01 provided in this embodiment of this application does not need to be manufactured with a TFT backplane, so that a weight of the display module 01 can be effectively reduced, and a thickness of the display module 01 can be reduced. On the other hand, some light-emitting chips 401 and the integrated chip 20 are disposed in a stacked manner, some light-emitting chips 401 and the circuit substrate 30 are disposed in a stacked manner, and both the integrated chip 20 and the circuit substrate 30 are disposed on a same side of the circuit board 14, which improves integration of the display module 01. In still another aspect, for example, the light-emitting chip 401 is a micro-LED. Compared with an OLED, the micro-LED has lower power consumption, which helps reduce a volume of a battery in the display module 01. In addition, compared with the OLED, the micro-LED has higher brightness and a smaller size, so that the micro-LED has a smaller aperture ratio. In this way, component space in the display module 01 can be effectively saved, and more electronic components can be integrated.

Figure 7A:
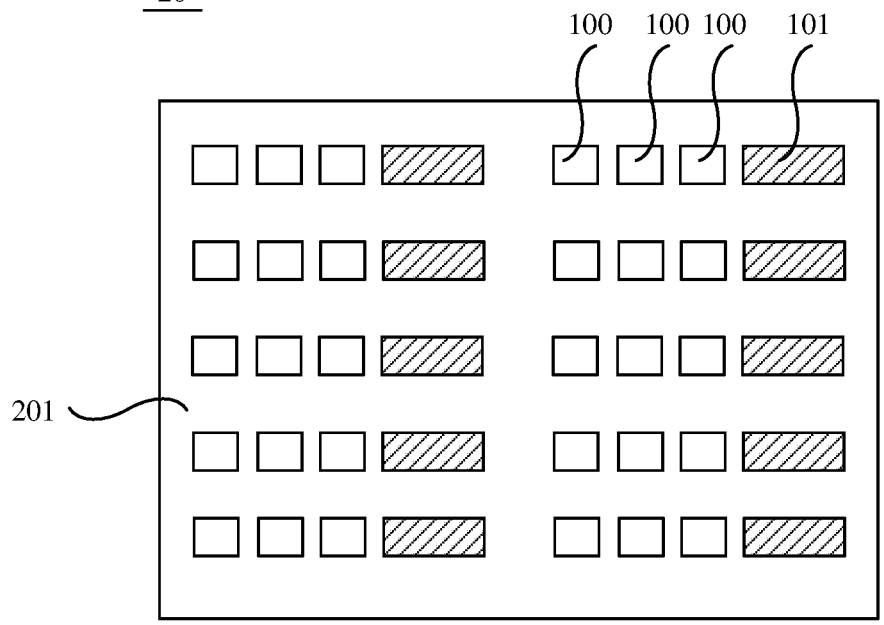
FIG. 7A is a schematic diagram of a structure of an integrated chip according to an embodiment of this application.
Figure 7B:
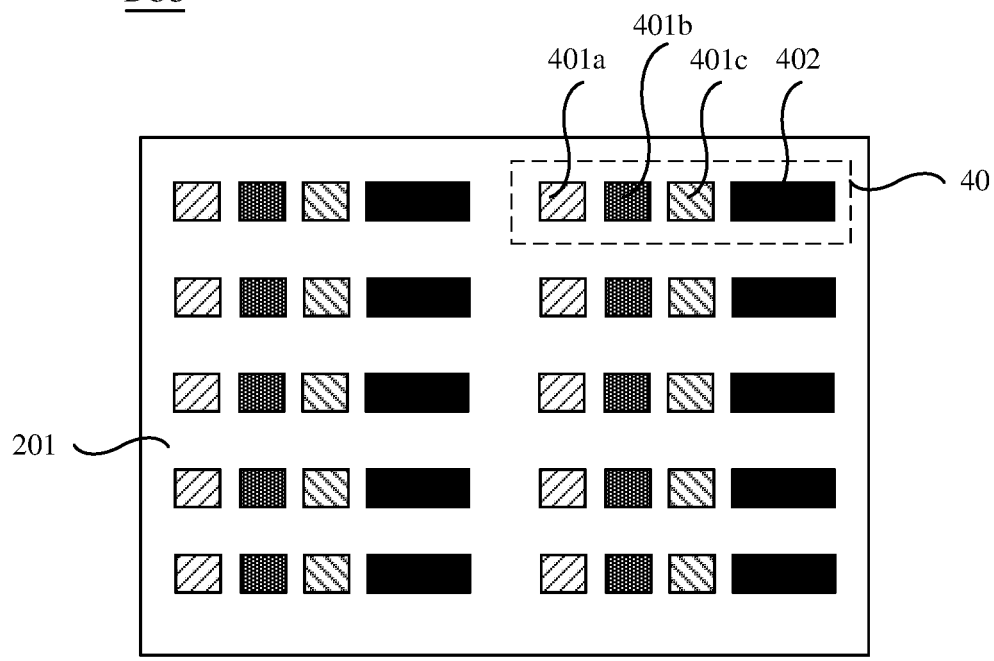
FIG. 7B is a schematic diagram of another structure of a DCU according to an embodiment of this application.

Based on this, to enable the display module 01 to have a fingerprint recognition function, as shown in FIG. 7A, the integrated chip 20 in the DCU may further include a plurality of fingerprint pixel collection circuits 101 integrated into the first chiplet 201. In this case, the pixel driving group 40 may be a minimum repetition unit of a component that is of the display module 01 and that is configured to implement a display function and a fingerprint collection function. In this case, as shown in FIG. 7B, when the pixel chipset 40 disposed on the first chiplet 201 further includes fingerprint collection chips 402, a fingerprint collection chip 402 disposed on the first chiplet 201 may be electrically connected to a fingerprint pixel collection circuit 101 (as shown in FIG. 7A) in the first chiplet 201. The fingerprint pixel collection circuit 101 is configured to drive the fingerprint collection chip 402 to perform fingerprint collection.

Figure 8A:
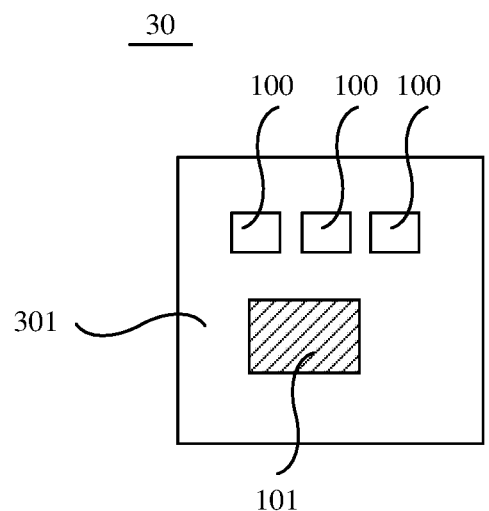
FIG. 8A is a schematic diagram of a structure of a circuit substrate according to an embodiment of this application.
Figure 8B:
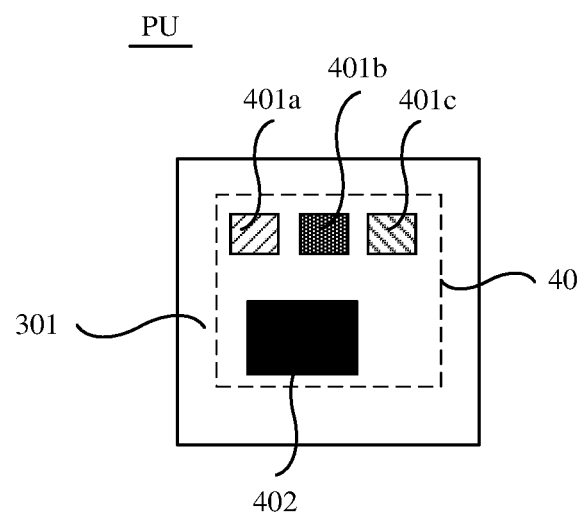
FIG. 8B is a schematic diagram of another structure of a PU according to an embodiment of this application.

In addition, the circuit substrate 30 in the PU may further include the fingerprint pixel collection circuit 101 shown in FIG. 8A that is integrated into the circuit substrate 30. In this case, as shown in FIG. 8B, when the pixel chipset 40 disposed on the substrate body 301 further includes the fingerprint collection chip 402, a fingerprint collection chip 402 disposed on the substrate body 301 may be electrically connected to a fingerprint pixel collection circuit 101 (as shown in FIG. 8A) in the circuit substrate 30.

In this case, the fingerprint collection chip 402 in each pixel chipset 40 may be used as a collection pixel of a fingerprint collector. In this way, a plurality of fingerprint collection chips 402 in different pixel chipsets 40 may jointly form the fingerprint collector. Therefore, the fingerprint collector does not need to be independently disposed on the circuit board 14, but collection pixels of the fingerprint collector are integrated into each pixel chipset 40, to help improve integration of the display module. In this case, the pixel chipset 40 disposed on the integrated chip 20 or at least one pixel chipset 40 in the pixel chipsets 40 disposed on the circuit substrate 30 may include the first light-emitting chip 401a, the second light-emitting chip 401b, the third light-emitting chip 401c, and the fingerprint collection chip 402.

It should be noted that the fingerprint pixel collection circuit 101 may include a plurality of transistors formed by using the CMOS process. A connection manner of the plurality of transistors in the fingerprint pixel collection circuit 101 is not limited in this application, provided that the fingerprint collection chip 402 electrically connected to the plurality of transistors can be driven to perform fingerprint collection.

A manner in which the fingerprint collection chip 402 performs fingerprint collection is not limited in this application. For example, the fingerprint collection chip 402 may collect a fingerprint in an optical manner, and in this case, a photoelectric conversion element is disposed in the fingerprint collection chip 402, to collect a type of the fingerprint by using a difference between ridges and valleys in the fingerprint in reflecting light, and the fingerprint collection chip 402 transmits a collection result to the SoC or the CPU. Alternatively, for another example, the fingerprint collection chip 402 may collect a fingerprint by using a semiconductor electrode and different capacitance (or inductance) values formed between the ridges and the valleys in the fingerprint, and transmit a collection result to the SoC or the CPU. The SoC or the CPU may obtain a fingerprint pattern based on the collection result of the fingerprint collection chip 402 and location coordinates of the fingerprint collection chip 402, to achieve the objective of fingerprint collection or recognition.

Figure 9A:
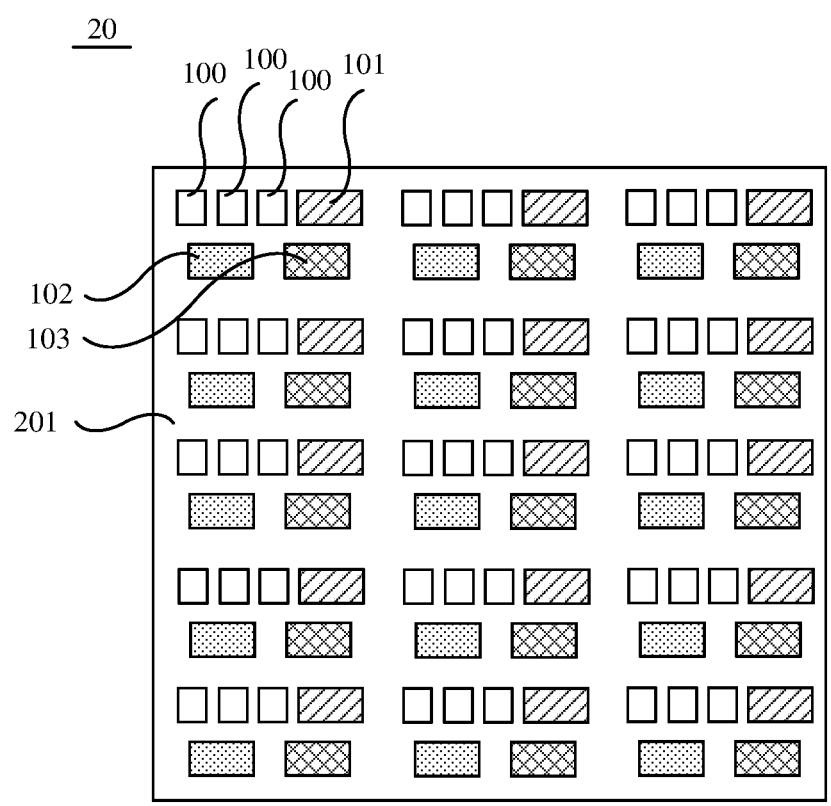
FIG. 9A is a schematic diagram of a structure of an integrated chip according to an embodiment of this application.

Based on this, to enable the display module 01 to have a facial or gesture recognition function, as shown in FIG. 9A, the integrated chip 20 in the DCU may further include a light-emitting pixel drive circuit 102 and a light-receiving pixel drive circuit 103 that are integrated into the first chiplet 201. For example, when the first chiplet 201 (for example, an SoC, a PMU, a CPU, a GPU, a UFS, or a DDR) is manufactured by using the CMOS process, the light-emitting pixel drive circuit 102 and the light-receiving pixel drive circuit 103, and the display pixel drive circuit 100 and the fingerprint pixel collection circuit 101 that are shown in FIG. 9A may be integrated into the first chiplet 201, to form the integrated chip 20.

Figure 9B:
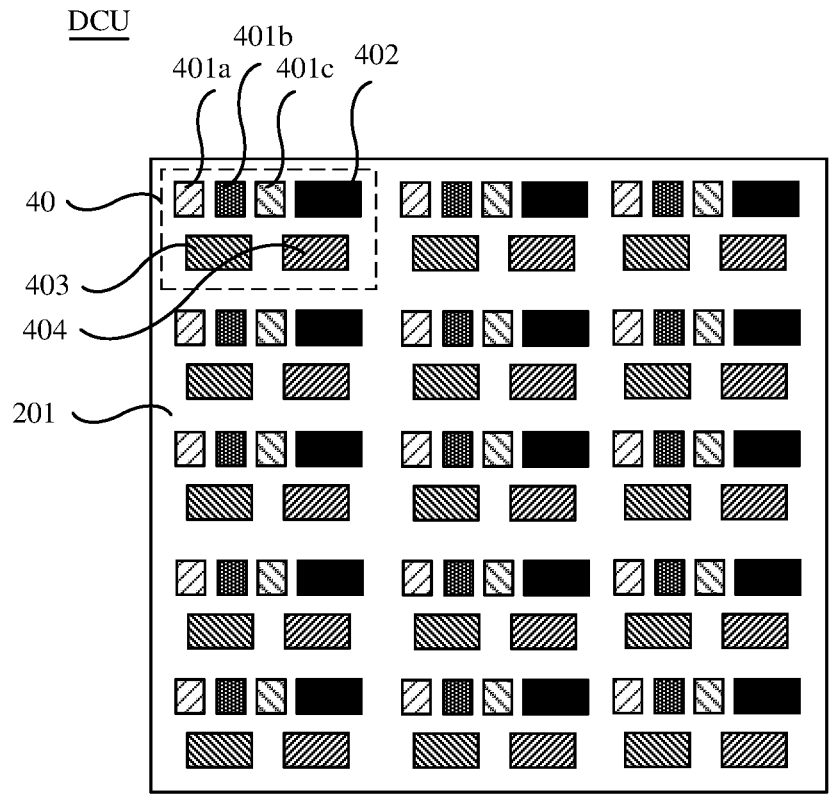
FIG. 9B is a schematic diagram of another structure of a DCU according to an embodiment of this application.

Based on this, the pixel driving group 40 may be a minimum repetition unit of a component that is of the display module 01 and that is configured to implement a display function and a facial or gesture recognition function. In this case, as shown in FIG. 9B, when the pixel chipset 40 disposed on the first chiplet 201 further includes a light-emitting chip 403 and a light-receiving chip 404, a die to wafer (die to wafer, D2 W) bonding manner, which may also be referred to as a chip to wafer (chip to wafer, C2 W) bonding (bonding) manner, may be used, so that the light-emitting chip 403 is disposed on the integrated chip 20 and is electrically connected to the light-emitting pixel drive circuit 102 (as shown in FIG. 9A) in the first chiplet 201. In addition, the light-receiving chip 404 may be disposed on the integrated chip 20 by using the D2 W bonding manner, and is electrically connected to the light-receiving pixel drive circuit 103 (as shown in FIG. 9A) in the first chiplet 201. The light-emitting pixel drive circuit 102 is configured to drive the light-emitting chip 403 to emit light, and the light-receiving pixel drive circuit 103 is configured to drive the light-receiving chip 404 to receive light.

Similarly, when the pixel chipset 40 disposed on the integrated chip 20 includes the first light-emitting chip 401a, the second light-emitting chip 401b, the third light-emitting chip 401c, and the fingerprint collection chip 402, a mass transfer method and the D2 W bonding manner may be used, so that any one of the first light-emitting chip 401a, the second light-emitting chip 401b, and the third light-emitting chip 401c is disposed on the integrated chip 20, and is electrically connected to a display pixel drive circuit 100 in the first chiplet 201. Similarly, by using the D2 W bonding manner, the fingerprint collection chip 402 is disposed on the integrated chip 20, and is electrically connected to the fingerprint pixel collection circuit 101 in the first chiplet 201. In this case, at least one pixel chipset 40 disposed on the integrated chip 20 may include the first light-emitting chip 401a, the second light-emitting chip 401b, the third light-emitting chip 401c, the fingerprint collection chip 402, the light-emitting chip 403, and the light-receiving chip 404.

Figure 10A:
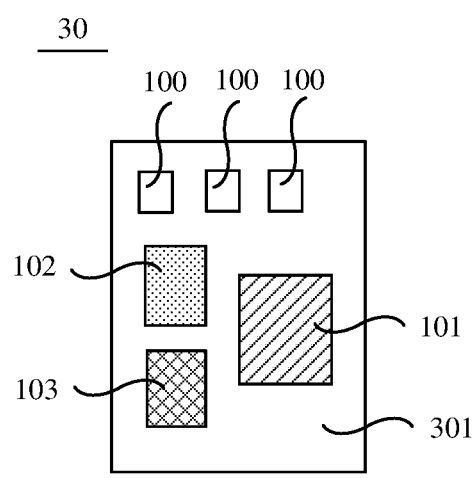
FIG. 10A is a schematic diagram of a structure of a circuit substrate according to an embodiment of this application.

In addition, as shown in FIG. 10A, the circuit substrate 30 in the PU may further include the light-emitting pixel drive circuit 102 and the light-receiving pixel drive circuit 103 that are integrated into the circuit substrate 30. For example, the light-emitting pixel drive circuit 102 and the light-receiving pixel drive circuit 103, and the transistors in the display pixel drive circuit 100 and the fingerprint pixel collection circuit 101 may be manufactured by using the CMOS process on a silicon (Si) wafer (wafer) 200 shown in FIG. 10B. Then, it can be learned from the foregoing descriptions that the RLD is manufactured on the wafer 200 on which the transistors are manufactured. The transistors in the wafer 200 are interconnected based on the design requirement by using the metal cables at the RLD, to form the light-emitting pixel drive circuit 102, the light-receiving pixel drive circuit 103, the display pixel drive circuit 100, and the fingerprint pixel collection circuit 101.

Figure 10B:
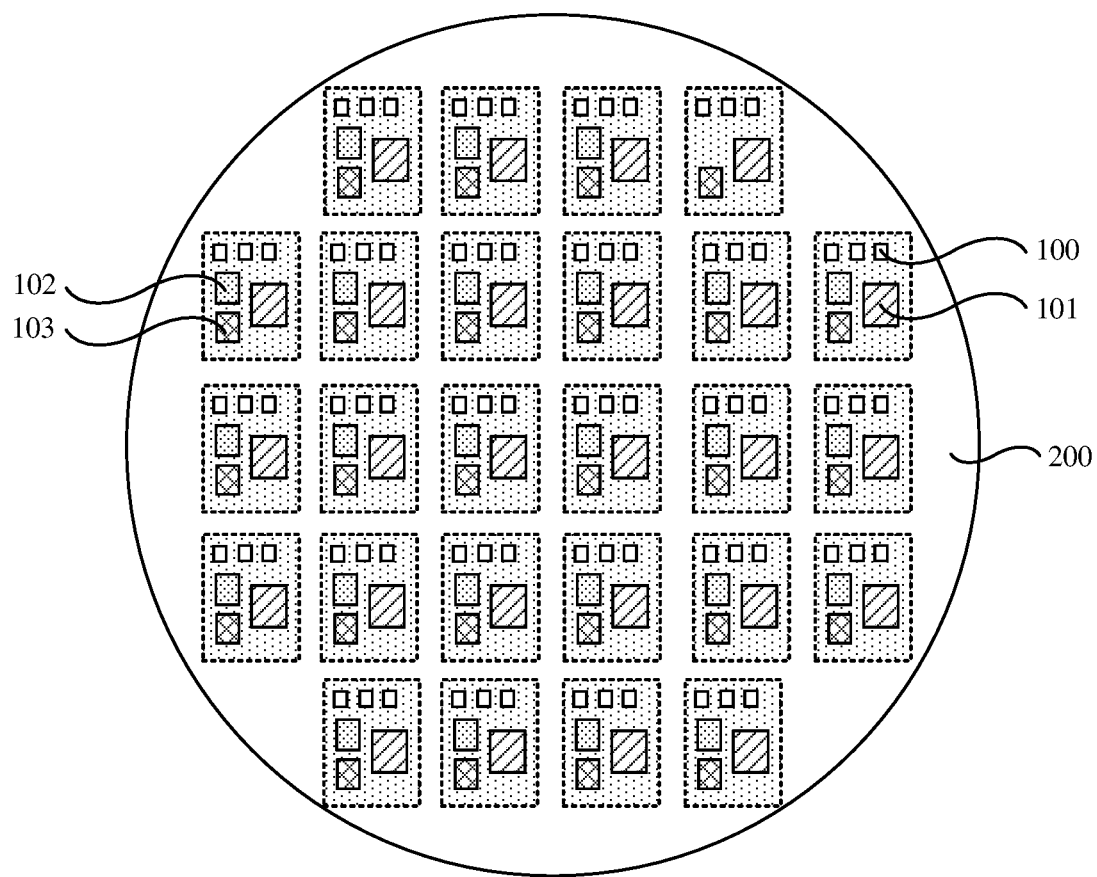
FIG. 10B is a schematic diagram of a structure of a wafer according to an embodiment of this application.
Figure 10C:
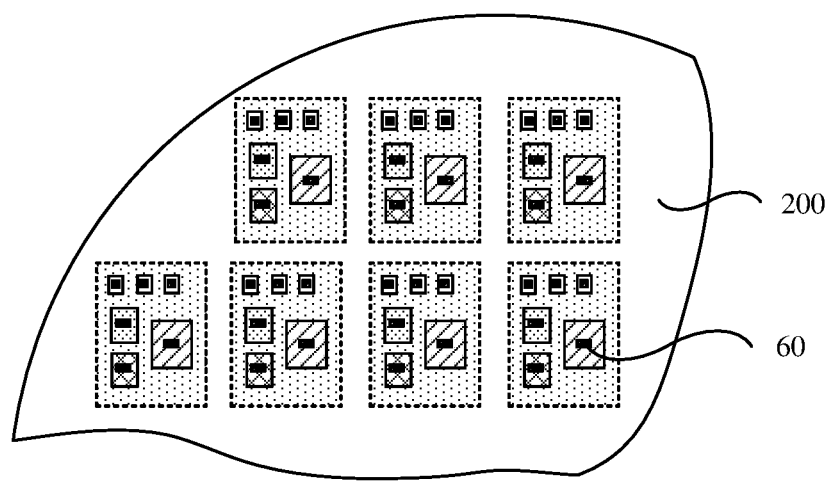
FIG. 10C is a schematic diagram of a partial structure of the wafer shown in FIG. 10B.
Figure 10D:
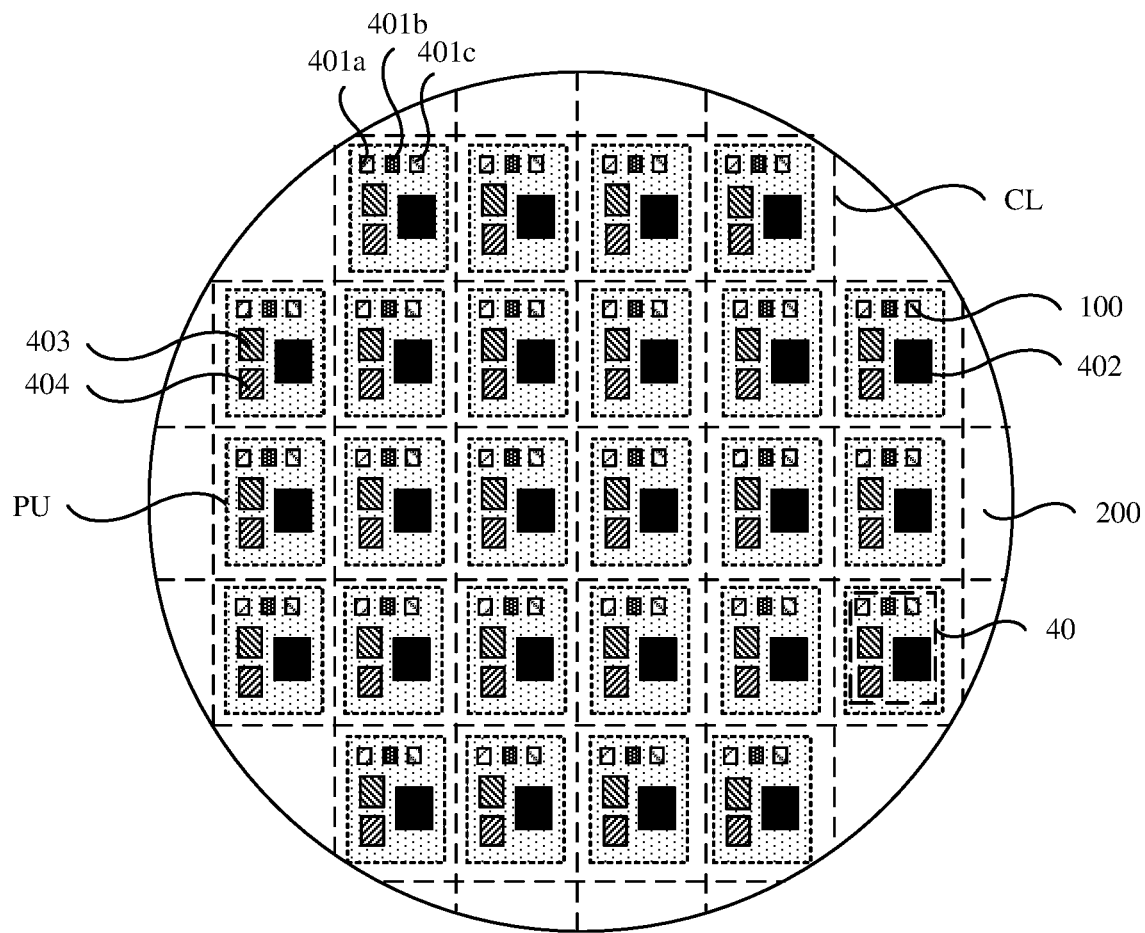
FIG. 10D is a schematic diagram of a structure of another wafer according to an embodiment of this application.

Based on this, a plurality of soldering pads 60 shown in FIG. 10C may be further manufactured on a surface of a side that is of the RLD and that is away from the wafer 200. Next, as shown in FIG. 10D, when the pixel chipset 40 disposed in the PU further includes the light-emitting chip 403 and the light-receiving chip 404, the D2 W bonding manner may be used, so that the light-emitting chip 403 is disposed on the wafer 200 through the soldering pad 60 (as shown in FIG. 10C) and is electrically connected to the light-emitting pixel drive circuit 102 (as shown in FIG. 10B) in the wafer 200. In addition, in the D2 W bonding manner, the light-receiving chip 404 is disposed on the wafer 200 through the soldering pad 60, and is electrically connected to the light-receiving pixel drive circuit 103 (as shown in FIG. 10B) in the wafer 200.

Similarly, when the pixel chipset 40 disposed in the PU includes the first light-emitting chip 401a, the second light-emitting chip 401b, the third light-emitting chip 401c, and the fingerprint collection chip 402, the mass transfer method and the D2 W bonding manner may be used, so that any one of the first light-emitting chip 401a, the second light-emitting chip 401*b*, and the third light-emitting chip 401*c* is disposed on the wafer 200 through the soldering pad 60, and is electrically connected to a display pixel drive circuit 100 (as shown in FIG. 10B) in the wafer 200. Similarly, in the D2 W bonding manner, the fingerprint collection chip 402 is disposed on the wafer 200 through the soldering pad 60, and is electrically connected to the fingerprint pixel collection circuit 101 (as shown in FIG. 10B) in the wafer 200. In this case, a pixel chipset 40 in at least one PU disposed on the wafer 200 may include the first light-emitting chip 401*a*, the second light-emitting chip 401*b*, the third light-emitting chip 401*c*, the fingerprint collection chip 402, the light-emitting chip 403, and the light-receiving chip 404.

Figure 10E:
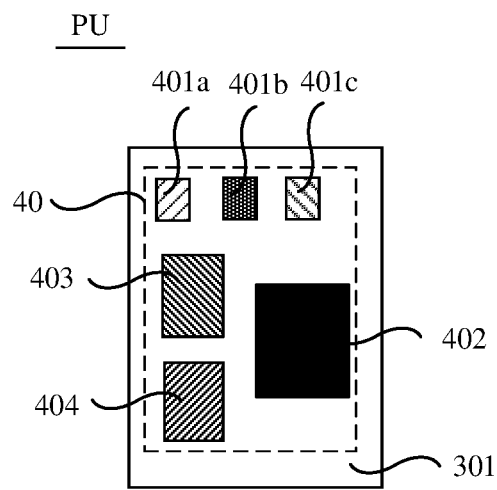
FIG. 10E is a schematic diagram of another structure of a PU according to an embodiment of this application.

Next, as shown in FIG. 10D, the wafer 200 may be cut along a cutting lane (CL) preset on the wafer 200 to form an independent PU shown in FIG. 10E.

Figure 11:
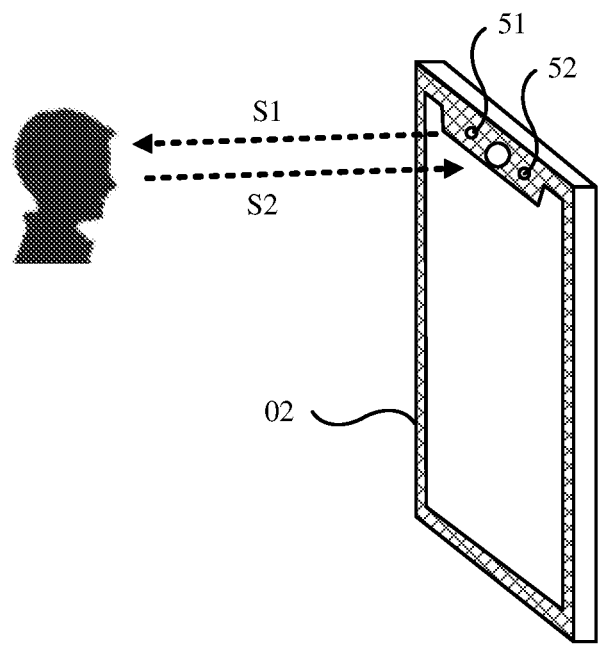
FIG. 11 is a schematic diagram of a structure of an electronic device according to an embodiment of this application.

In this case, the light-emitting chip 403 in each pixel chipset 40 may be used as a pixel of a light emitter 51 shown in FIG. 11. In this way, a plurality of light-emitting chips 403 in different pixel chipsets 40 may jointly form the light emitter 51. Therefore, the light emitter 51 does not need to be independently disposed on the circuit board 14, but pixels of the light emitter 51 are integrated into each pixel chipset 40, to help improve integration of the display module. Similarly, the light-receiving chip 404 in each pixel chipset 40 may be used as a pixel of a light receiver 52 shown in FIG. 11. In this way, a plurality of light-receiving chips 404 in different pixel chipsets 40 may jointly form the light receiver 52. Therefore, the light receiver 52 does not need to be independently disposed on the circuit board 14, but pixels of the light receiver 52 are integrated into each pixel chipset 40, to help improve integration of the display module.

It should be noted that, it can be learned from the foregoing descriptions that the light-emitting pixel drive circuit 102 and the light-receiving pixel drive circuit 103 may include a plurality of transistors formed by using the CMOS process. A connection manner of the plurality of transistors in the light-emitting pixel drive circuit 102 and the light-receiving pixel drive circuit 103 is not limited in this application, provided that the light-emitting pixel drive circuit 102 can drive the light-emitting chip 403 electrically connected to the light-emitting pixel drive circuit 102 to emit light, and the light-receiving pixel drive circuit 103 can drive the light-receiving chip 404 electrically connected to the light-receiving pixel drive circuit 103 to receive light.

For example, a manner of implementing facial or gesture recognition by using the light emitter 51 and the light receiver 52 shown in FIG. 11 is not limited in this application. For example, a face or a gesture can be recognized by recognizing deformation of structured light. In this case, each light-emitting chip 403 used as the pixel in the light emitter 51 may be controlled to emit light, so that the light emitter 51 emits light S1 with a specific pattern. When the light irradiates on a user face shown in FIG. 11, the user face reflects the incident light, to form reflected light S2. Next, each light-receiving chip 404 used as the pixel in the light receiver 52 receives the reflected light S2, performs photoelectric conversion, converts an optical signal into an electrical signal, and transmits the electrical signal to the SoC or the CPU. The SoC or the CPU may obtain, based on the signal output by the light receiver 52 and location coordinates of each light-receiving chip 404 in the light receiver 52, a pattern of the reflected light S2 of the user face, and compare the pattern with an original pattern of the light S1 transmitted by the light emitter 51, to obtain a deformation degree of the structured light, and finally recognize the face (or the gesture) of the user.

Alternatively, for another example, a face or a gesture may be recognized by recognizing a time of flight (time of flight, TOF) of light. In this case, each light-emitting chip 403 in the light emitter 51 may be controlled to emit light S1. When the light irradiates on a user face shown in FIG. 11, the user face reflects the incident light, to form reflected light S2. Next, each light-receiving chip 404 in the light receiver 52 receives the reflected light S2 of the user face. The SoC or the CPU obtains a distance between the user face and the display module 01 based on time when the light receiver 52 receives the reflected light S2 and location coordinates of each light-receiving chip 404 in the light receiver 52, to recognize the face (or gesture) of the user.

Based on this, the DCU and the PU may be disposed on the first surface A1 of the circuit board 14, and electrically connected to the circuit board 14, to form a display of the display apparatus 01. Manners in which the DCU and the PU in the display module 01 are disposed are described by using an example in which the display module 01 in the electronic device 02 has the DCU shown in FIG. 9B and the PU shown in FIG. 10B, and the pixel chipset 40 in the DCU and the PU includes the first light-emitting chip 401*a*, the second light-emitting chip 401*b*, the third light-emitting chip 401*c*, the fingerprint collection chip 402, the light-emitting chip 403, and the light-receiving chip 404.

Figure 12:
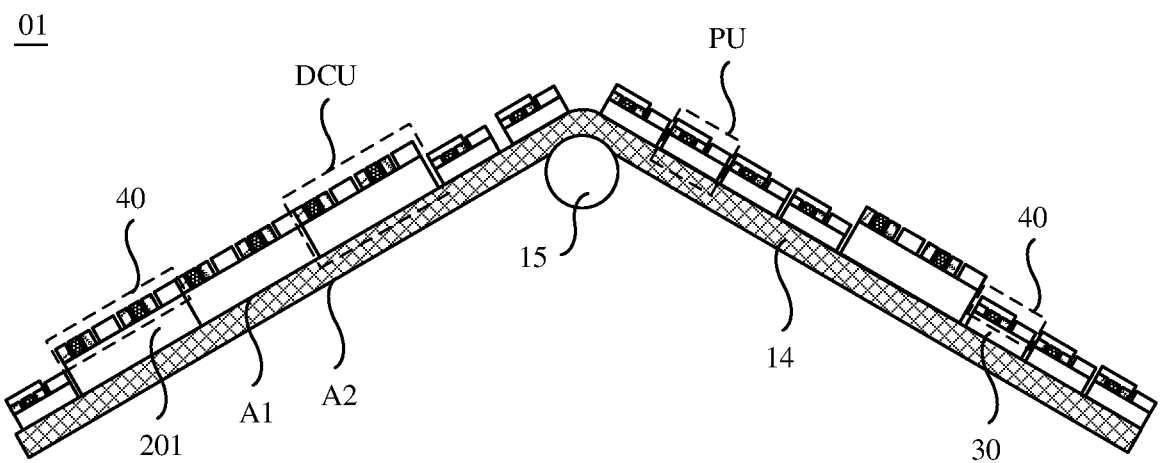
FIG. 12 is a schematic diagram of a structure of a foldable display module according to an embodiment of this application.

In some embodiments of this application, as shown in FIG. 12, the circuit board 14 configured to carry the DCU and the PU is a flexible circuit board (flexible printed circuit, FPC). Based on this, the display apparatus 01 may further include a rotating shaft 15. The rotating shaft 15 may be disposed on a side on which the second surface A2 of the circuit board 14 is located. In this way, under the action of the rotating shaft 15, the circuit board 14 may be bent at the location of the rotating shaft 15, so that the entire display module 01 can be folded.

Figure 13A:
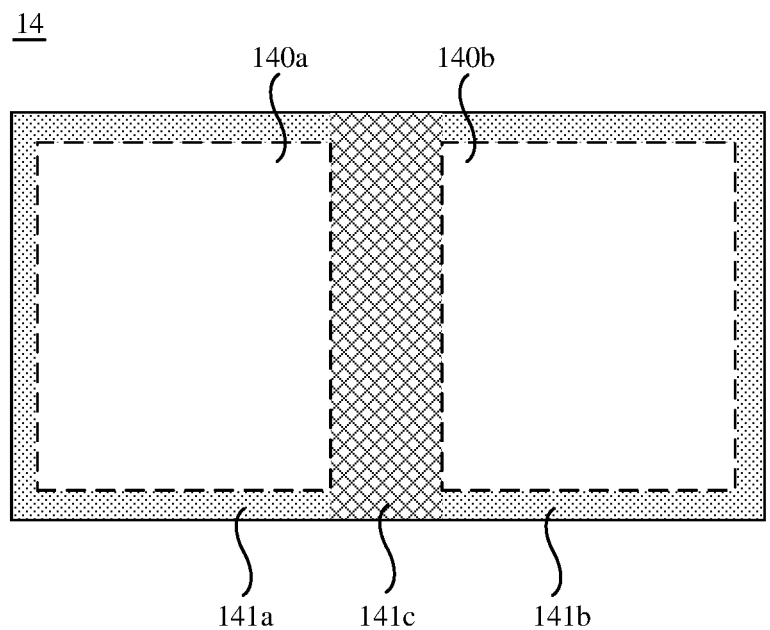
FIG. 13A is a schematic diagram of region division of the circuit board in FIG. 12.
Figure 13B:
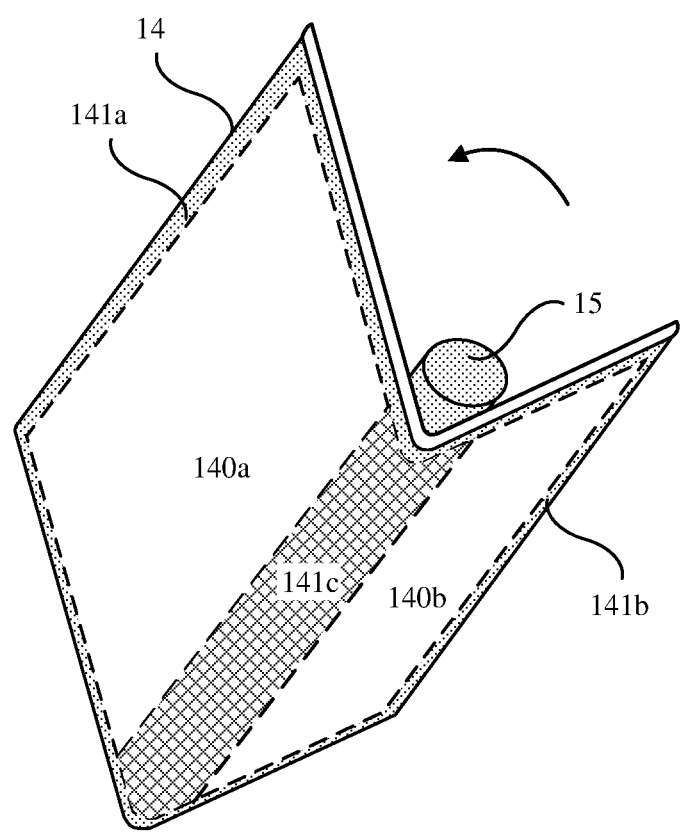
FIG. 13B is a schematic diagram of a bending structure of the circuit board in FIG. 12.

In this case, as shown in FIG. 13A, the circuit board 14 may include a first main view region 140*a*, a second main view region 140*b*, a first surrounding region 141*a*, a second surrounding region 141*b*, and a bending region 141*c*. The bending region 141*c* is located between the first main view region 140*a* and the second main view region 140*b*. In addition, as shown in FIG. 13B, a vertical projection of the rotating shaft 15 on the circuit board 14 is located in the bending region 141*c* shown in FIG. 13A. In this case, when the circuit board 14 is bent under the action of the rotating shaft 15, a part in which the bending region 141*c* is located in the circuit board 14 is bent and deformed. In addition, the first surrounding region 141*a* is disposed around the first main view region 140*a*, and the second surrounding region 141*b* is disposed around the second main view region 140*b*.

Figure 14A:
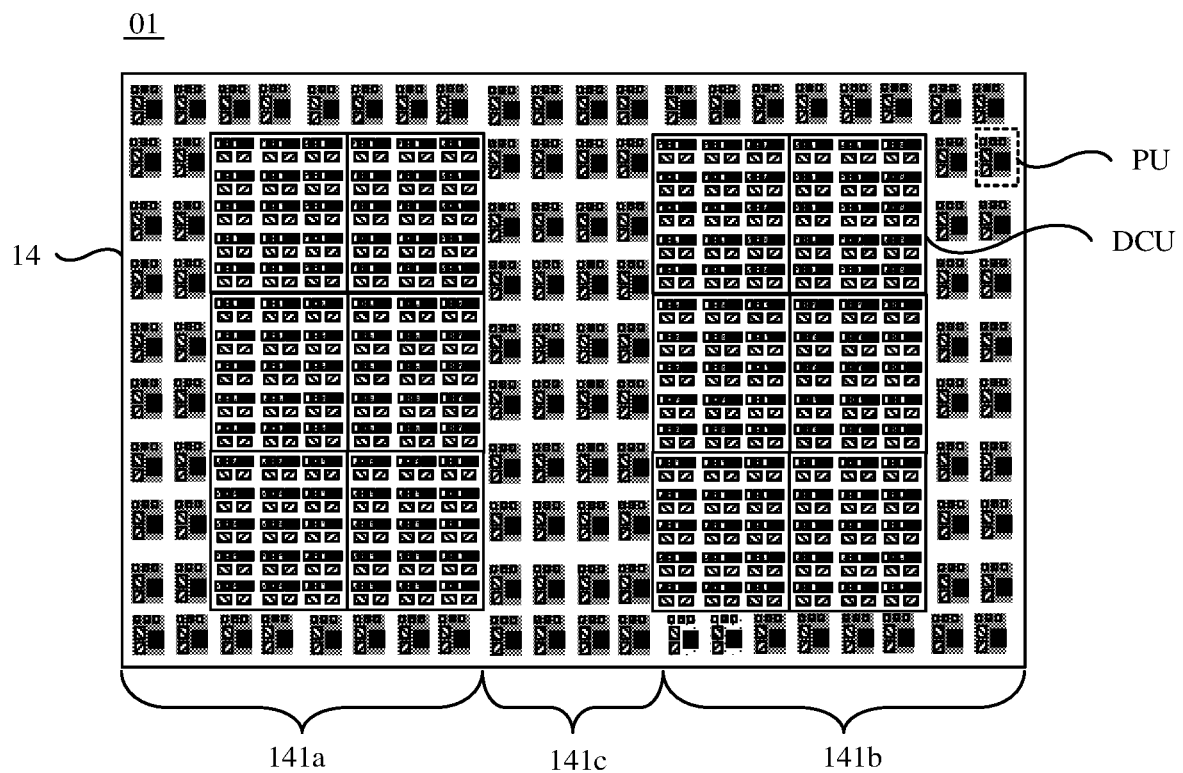
FIG. 14A is a schematic diagram of a structure of a display module according to an embodiment of this application.

It can be learned from the foregoing descriptions that the area of the vertical projection of the integrated chip 20 in the DCU on the circuit board 14 is greater than the area of the vertical projection of the circuit substrate 30 in the PU on the circuit board 14. For example, a single-side size of the DCU is at a millimeter level, and a single-side size of the PU is at a micrometer level. In addition, in a bending process of the circuit board 14, the bending region 141*c* is deformed. In this case, as shown in FIG. 14A, a PU with a small size may be disposed in the bending region 141*c*. Because the size of the PU is small, a contact area between the PU and the bending region 141*c* is small relative to a deformation area of the bending region 141*c*. Therefore, in a process in which the bending region 141*c* is bent, the PU is not easily crack. This helps improve product reliability.

In addition, the first surrounding region 141*a* and the second surrounding region 141*b* of the circuit board 14 are located at the edge of the circuit board 14. In this case, in a transportation or use process of the display module 01, the first surrounding region 141a and the second surrounding region 141b are prone to slightly deform under external force, for example, in a collision process. Therefore, the PU with the small size may be disposed in the first surrounding region 141a and the second surrounding region 141b, so that when the display module 01 is under external force, and a collision occurs in the first surrounding region 141a and the second surrounding region 141b, the PU is not easily to crack. This helps improve the product reliability.

Figure 14B:
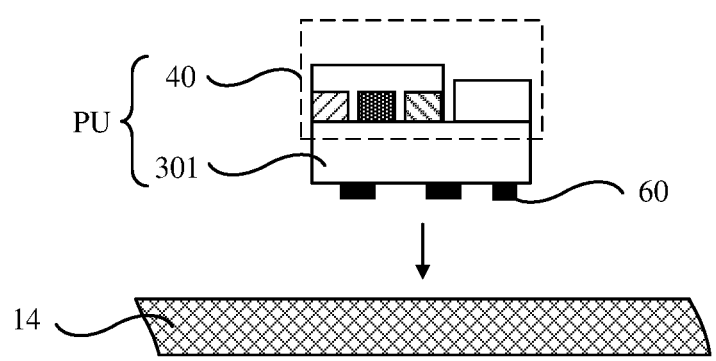
FIG. 14B is a schematic diagram of a process of binding a PU to a circuit board according to an embodiment of this application.

For example, after the wafer 200 is cut along the cutting lane (CL) shown in FIG. 10C to form the independent PU shown in FIG. 10D, a chip to flexible circuit board (chip to FPC) process may be used, so that each independent PU is soldered to the first surrounding region 141a, the second surrounding region 141b, and the bending region 141c of the circuit board 14 shown in FIG. 14A through the soldering pad 60 (as shown in FIG. 14B) disposed on a surface of a side that is of the substrate body 301 and that is away from the pixel integration component 40 in the PU, to electrically connect to the circuit board 14, so as to complete PU assembly.

In addition, because a size of the DCU is large, and a contact area between the DCU and the circuit board 14 is large, the DCU may be disposed in a region that is in the circuit board 14 and that is not prone to deformation, for example, the first main view region 140a and the second main view region 140b shown in FIG. 13B. In this case, as shown in FIG. 14A, a plurality of PUs are distributed around a plurality of DCUs arranged together in a matrix form.

Figure 14C:
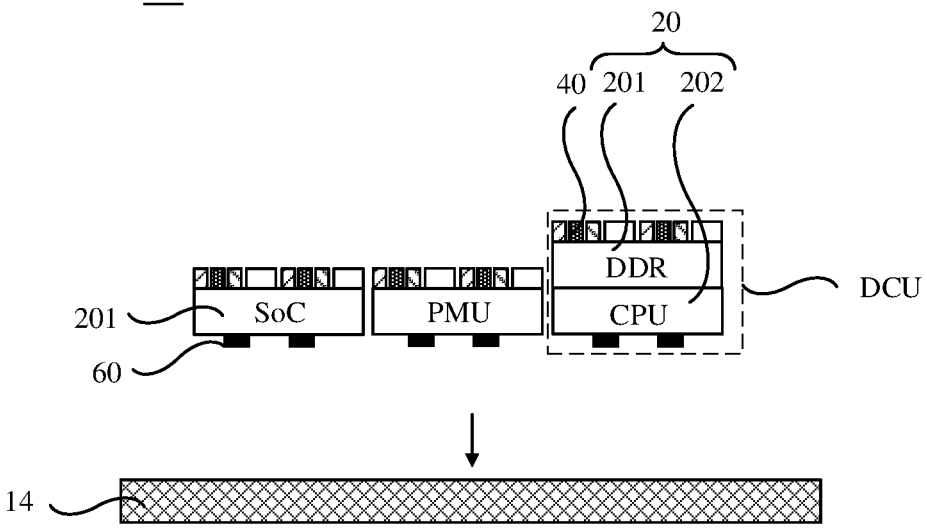
FIG. 14C is a schematic diagram of a process of binding a DCU to a circuit board according to an embodiment of this application.

In some embodiments of this application, when the display module 01 has a plurality of DCUs and the plurality of DCUs need to communicate with each other, a circuit (not shown in the figure) configured to implement mutual communication between the plurality of DCUs may be manufactured in the circuit board 14. In this case, a chip to flexible circuit board (chip to FPC) bonding manner may be used, as shown in FIG. 14C, so that each DCU is soldered, through the soldering pad 60 on a side that is of the integrated chip 20 and that is close to the circuit board 14, to the circuit board 14, to electrically connect to the circuit board 14, so as to implement DCU assembly.

Figure 14D:
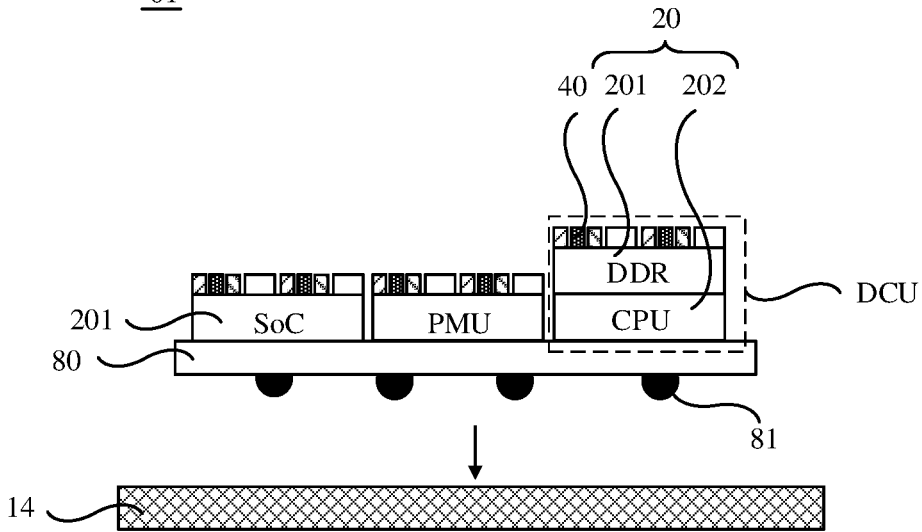
FIG. 14D is a schematic diagram of another process of binding a DCU to a circuit board according to an embodiment of this application.

Alternatively, in some other embodiments of this application, when the display module 01 has a plurality of DCUs that need to communicate with each other, but space for manufacturing a circuit in the circuit board 14 is limited, as shown in FIG. 14D, the display module 01 may further include an interposer (interposer) 80. The interposer 80 is electrically connected to the circuit board 14, and at least two DCUs are disposed on a surface of a side that is of the interposer 80 and that is away from the circuit board 14. A circuit configured to implement mutual communication between the at least two DCUs is formed in the interposer 80. In this way, different DCUs may be first integrated into the interposer 80 to form an integrated module by using a chiplet (including the first chiplet 201 and the second chiplet 202) formed by using different process nodes in the integrated chip 20 and by using the flip-chip bonding process. Then, the integrated module may be bonded, through a solder ball (solder ball) 81 disposed on a side that is of the interposer 80 and that is close to the circuit board 14, to the circuit board 14, to electrically connect to the circuit board 14, so as to implement DCU assembly.

It should be noted that, the chiplet formed by using different process nodes means that process nodes (for example, minimum line widths of transistors in the chiplet) used in processes of manufacturing different chiplets are different. For example, when the chiplet is an SoC, the process node may be 7 nm, 5 nm, or 3 nm. When the chiplet is a PMU, the process node may be but is not limited to 90 nm. When the chiplet is a UFS, the process node may be but is not limited to 14 nm.

Figure 15A:
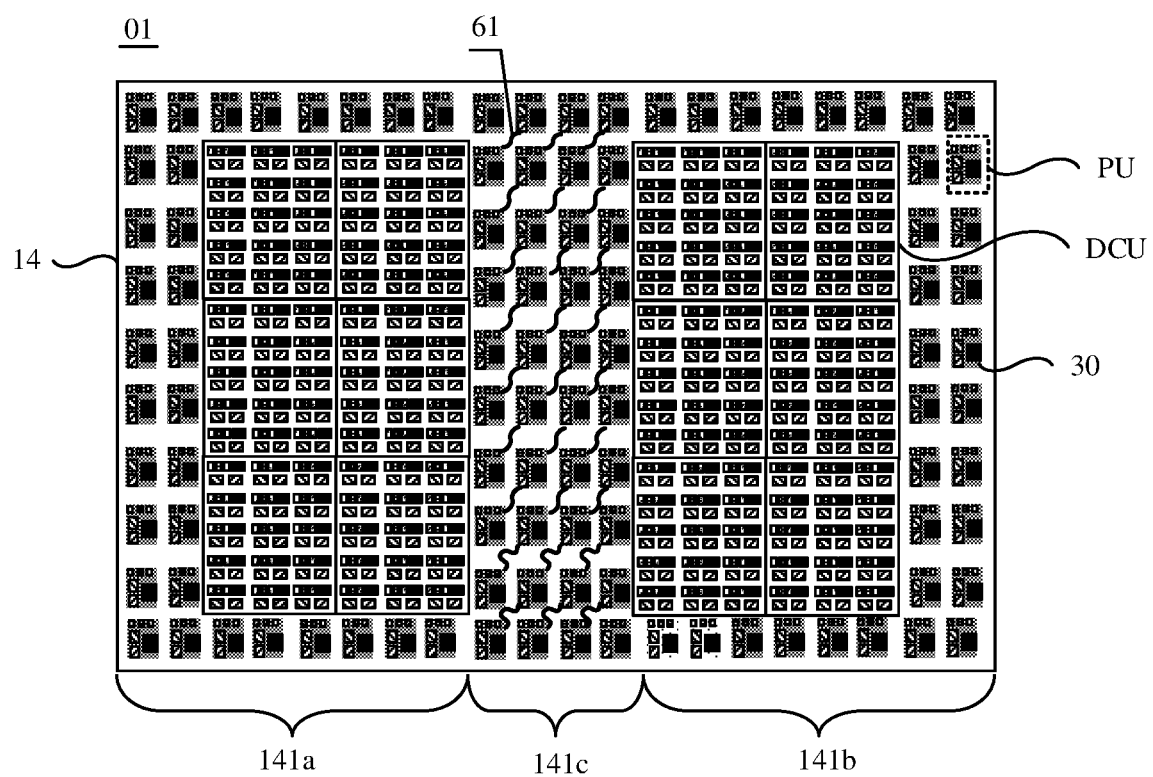
FIG. 15A is a schematic diagram of a structure of another display module according to an embodiment of this application.

It can be learned from the foregoing descriptions that when a user folds the display module 01, the bending region 141c of the circuit board 14 is bent, and a deformation amount of the bending region 141c is greater than a deformation amount of the first surrounding region 141a and the second surrounding region 141b that deform due to a collision. Therefore, to further prevent the PU located in the bending region from cracking and improve bending reliability of the display module 01, as shown in FIG. 15A, the circuit board 14 further includes a plurality of metal cables 61 disposed in the bending region 141c.

The metal cable 61 may be manufactured together in a process of manufacturing the circuit board 14. A material forming the metal cable 61 may be a commonly used metal material in the circuit board 14, for example, copper. The metal cable 61 is in a curved shape, for example, S-shaped or Ω-shaped. In addition, two ends of the metal cable 61 are respectively connected to circuit substrates 30 of two PUs. When the foregoing chip to flexible circuit board bonding process is used, and each independent PU is soldered to the bending region 141c of the circuit board 14 through the soldering pad 60 (as shown in FIG. 14B) disposed on the circuit substrate 30, the circuit substrates 30 of the two PUs may be connected to the metal cables 61 on the circuit board 14. In this way, because the metal cable 61 has certain tensile performance, and can deform with bending of the bending region 141c, stress generated at a location of the PU due to the deformation of the bending region 141c is reduced, to further reduce a probability that a crack occurs in the PU.

Figure 15B:
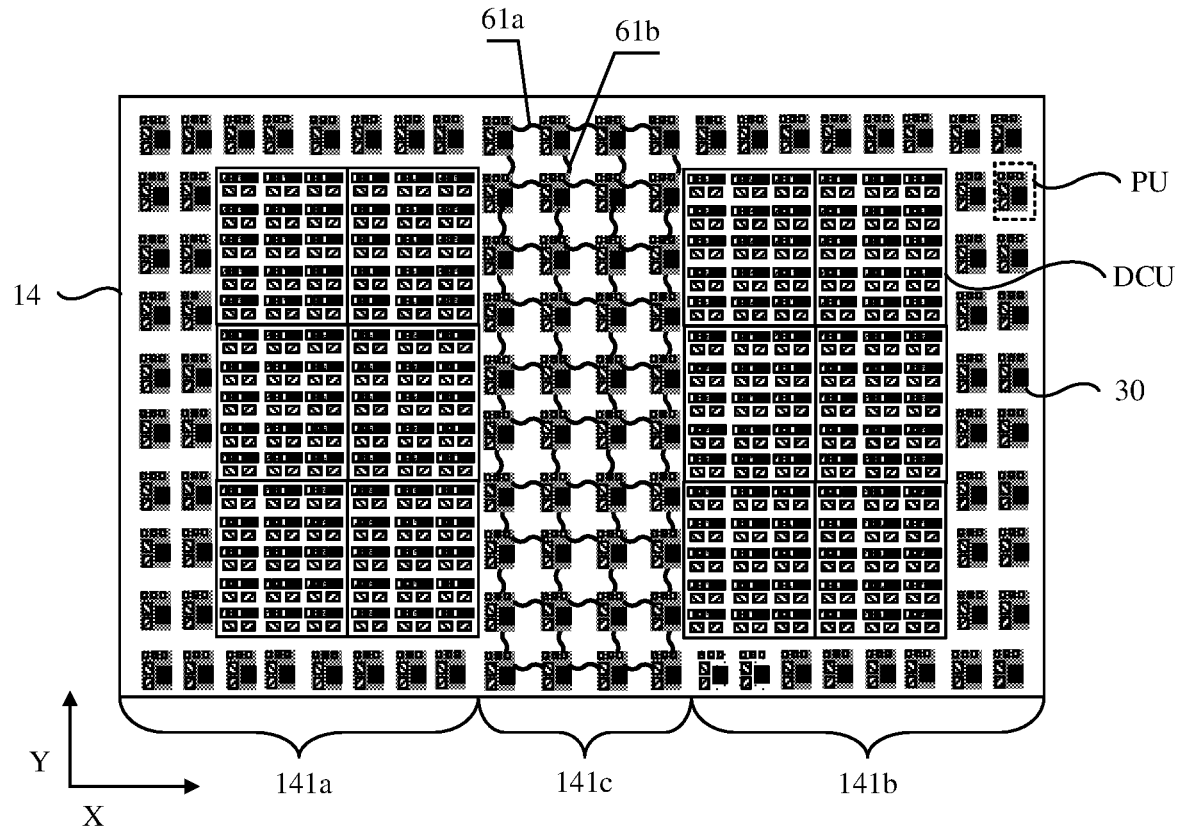
FIG. 15B is a schematic diagram of a structure of another display module according to an embodiment of this application.

In some embodiments of this application, as shown in FIG. 15B, circuit substrates 30 in a plurality of PUs in the bending region 141c are arranged in a matrix form. In this case, the plurality of metal cables include a plurality of first metal cables 61a and a plurality of second metal cables 61b. The first metal cable 61a is connected to circuit substrates 30 in two adjacent PUs along a first direction X, and the second metal cable 61b is connected to circuit substrates 30 in two adjacent PUs along a second direction Y. The first direction is perpendicular to the second direction. In this way, the plurality of first metal cables 61a and the plurality of second metal cables 61b may form a net structure to connect the plurality of PUs in the bending region 141c, so that resilience of the bending region 141c can be improved, and a probability that a crack occurs in the PU can be further reduced.

Figure 16A:
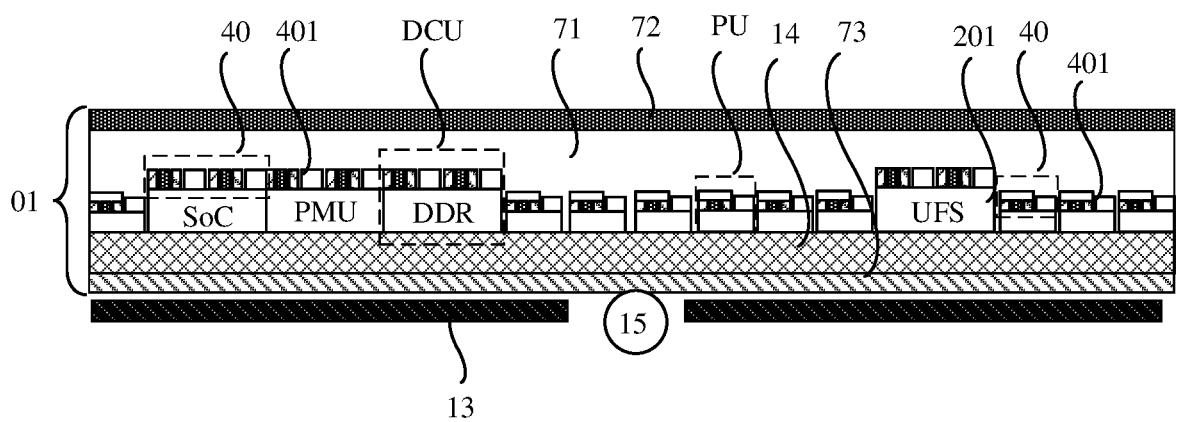
FIG. 16A is a schematic diagram of a structure of another electronic device according to an embodiment of this application.

Based on this, after both the DCU and the PU are disposed on the circuit board 14, as shown in FIG. 16A, a packaging layer 71 and a cover 72 may be further sequentially manufactured on a side that is of the DCU and the PU and that is away from the circuit board 14. The packaging layer 71 covers the DCU and the PU, and is configured to protect the DCU and the PU, to prevent the DCU and the PU from being eroded by water and oxygen. The cover 72 covers a surface of a side that is of the packaging layer 71 and that is away from the circuit board 14, and is connected to the packaging layer 71, to protect the packaging layer 71. For example, a material forming the packaging layer 71 may be a transparent resin material, and a resin thin film may be directly formed, by using a film forming process, on a surface of the side that is of the DCU and the PU and that is away from the circuit board 14, to serve as the packaging layer 71.

Therefore, compared with a packaging structure that includes a plurality of layers of alternately disposed organic thin film layers and inorganic thin film layers and that is formed by a thin film encapsulation (thin film encapsulation) process used by the AMOLED display module, a structure and a manufacturing process of the packaging layer 71 of the display module 01 provided in this embodiment of this application are simpler. When the display module 01 is a flexible display module, a material forming the cover 72 may be a transparent resin material. It should be noted that the transparent material in this embodiment of this application means that transmittance of the material may reach more than 85%.

In addition, the display module 01 may further include a heat dissipation layer 73 shown in FIG. 16A. The heat dissipation layer 73 may cover a surface of a side that is of the circuit board 14 and that is away from the DCU (including the integrated chip 20 and the pixel chipset 40) and the PU (including the circuit substrate 30 and the pixel chipset 40), and is connected to the circuit board 14. A material forming the heat dissipation layer 73 may include graphene. The battery 13 may be located on a side that is of the heat dissipation layer 73 and that is away from the circuit board 14. The heat dissipation layer 73 can transfer heat generated by the light-emitting chip 401 in the DCU and the PU and heat generated by the battery 13 to other components, for example, a housing (at a location in the figure) of the display module 01. In this way, because the housing is in contact with air, heat inside the display module 01 can be transferred to the outside of the display module 01, to dissipate heat.

It should be noted that a quantity of batteries 13 is not limited in this application. For example, as shown in FIG. 16A, the display module 01 may include two batteries 13, which are respectively located on two sides of the rotating shaft 15.

Figure 16B:
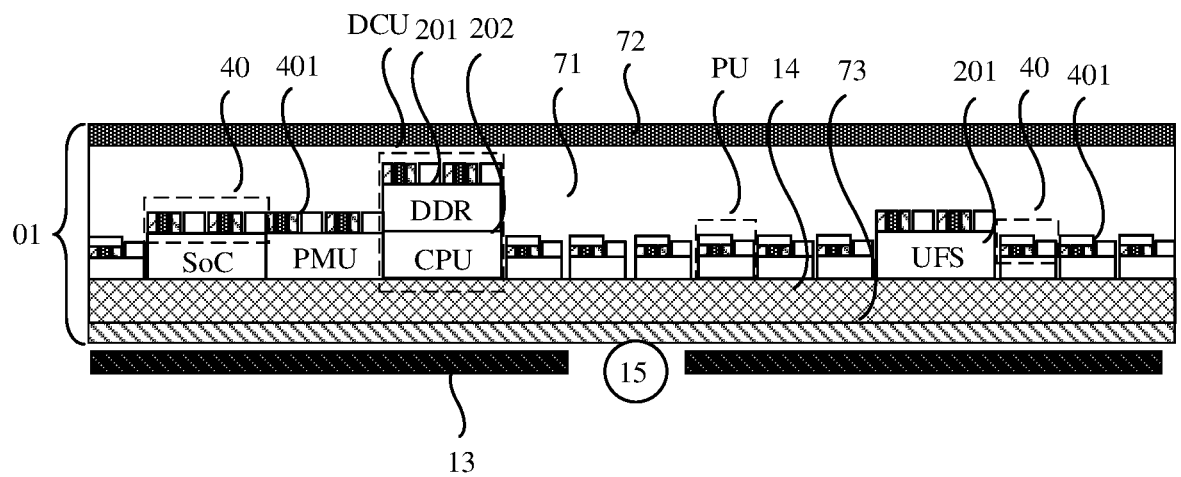
FIG. 16B is a schematic diagram of a structure of another electronic device according to an embodiment of this application.

It can be learned from FIG. 16A that first chiplets 201 in different DCUs may be different. For example, the first chiplets 201 in different locations shown in FIG. 16A may be an SoC, a PMU, a DDR, and a USF. In this way, more chips with different functions can be integrated into the display module 01. In addition, it can be learned from the foregoing descriptions that the DCU may further include the first chiplet 201 and the second chiplet 202 that are disposed in the stacked manner and that are shown in FIG. 16B. The two chiplets are disposed in the stacked manner, so that component space of the display module 01 can be further reduced, to facilitate integration of more chips with different functions.

Figure 17:
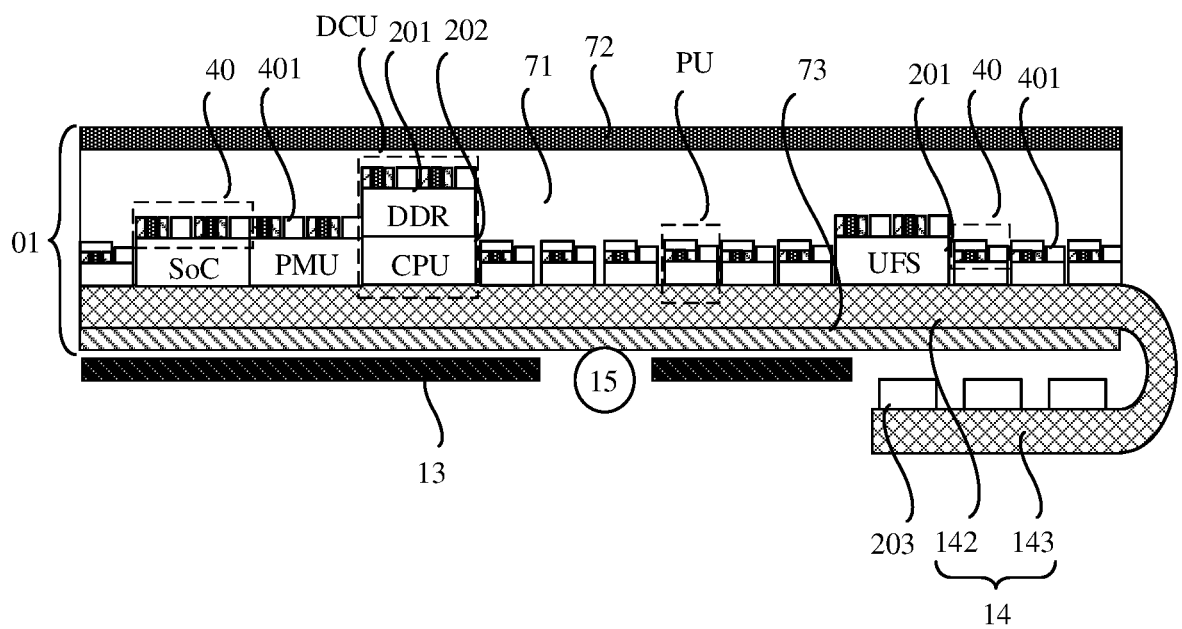
FIG. 17 is a schematic diagram of a structure of another electronic device according to an embodiment of this application.

Based on this, when the circuit board 14 is an FPC, to enable the display module 01 to integrate more additional electronic components, as shown in FIG. 17, the circuit board 14 may include a first part 142 and a second part 143 connected to the first part 142. A plurality of DCUs (including the integrated chip 20 and the pixel chipset 40) and a plurality of PUs (including the circuit substrate 30 and the pixel chipset 40) are disposed in the first part 142. In this case, a vertical projection of the pixel chipset 40 disposed on the side that is of the DCU and the PU and that is away from the circuit board 14 on the circuit board 14 may be located in the first part 142 of the circuit board 14. In addition, the second part 143 is bent on a side that is of the first part 142 and that is away from the DCU.

In this case, the display module 01 further includes at least one additional electronic component 203, and the additional electronic component 203 is disposed on a surface that is of the second part 143 and that is close to the first part 142, and is electrically connected to the circuit board 14. In some embodiments of this application, the additional electronic component 203 may be a chip, for example, an SoC, a PMU, a CPU, a GPU, a UFS, or a DDR. Alternatively, in some other embodiments of this application, the additional electronic component 203 may be a component such as a sensor.

Figure 18A:
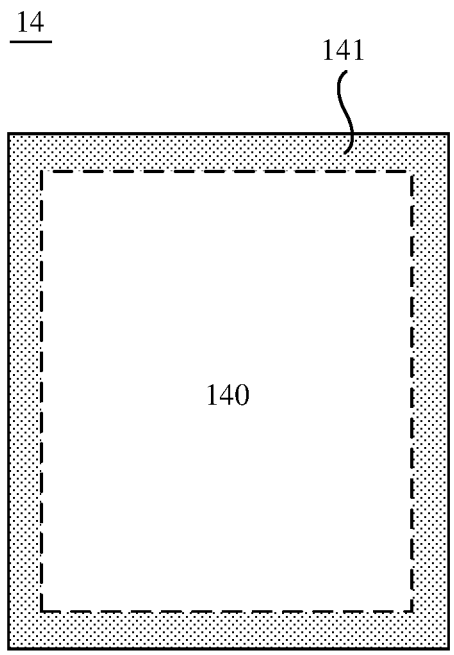
FIG. 18A is a schematic diagram of region division of a circuit board according to an embodiment of this application.

The foregoing descriptions are provided by using an example in which the circuit board 14 is the FPC. In some other embodiments of this application, the circuit board 14 may alternatively be a PCB. In this case, the display module 01, for example, a mobile phone, is a bar-type mobile phone that cannot be folded. In this case, as shown in FIG. 18A, the circuit board 14 may include a main view region 140 and a surrounding region 141 located around the main view region 140.

Figure 18B:
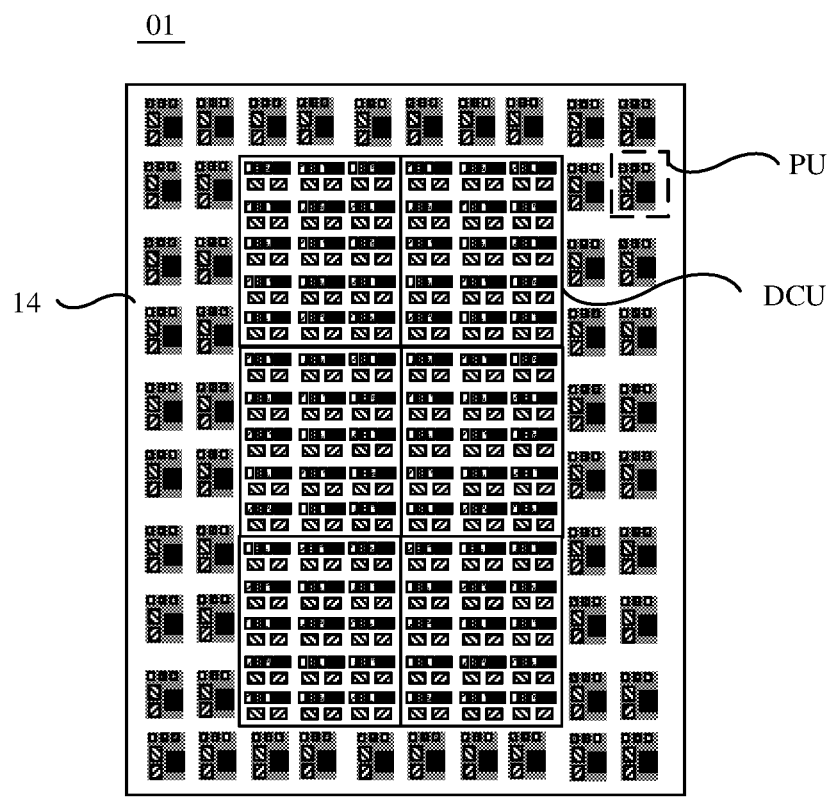
FIG. 18B is a schematic diagram of a structure of a display module including the circuit board shown in FIG. 18A.

It can be learned from the foregoing descriptions that because the surrounding region 141 is located around the main view region 140, in a transportation or use process of the display module 01, the surrounding region 141 is prone to slightly deform under external force, for example, in a collision process. However, the main view region 140 located inside the surrounding region 141 is not prone to deformation under external force. Therefore, the PU with a small size may be disposed in the surrounding region 141, so that when the display module 01 is under external force, and a collision occurs in the surrounding region 141, the PU is not easily to crack. This helps improve product reliability. In addition, a DCU with a large size is disposed in the main view region 140 that is not prone to deformation. In this case, as shown in FIG. 18B, a plurality of PUs (including the circuit substrate 30 and the pixel chipset 40) are distributed around a plurality of DCUs (including the integrated chip 20 and the pixel chipset 40) arranged together in a matrix form.

It should be noted that a manner in which the DCU and the PU are disposed on the circuit board 14, and are electrically connected to the circuit board 14 is the same as that described above. Details are not described herein again. The foregoing descriptions are provided by using an example in which the pixel chipset 40 of each DCU and the pixel chipset 40 of each PU further include the fingerprint collection chip 402, the light-emitting chip 403, and the light-receiving chip 404 in addition to the plurality of light-emitting chips (for example, the first light-emitting chip 401a, the second light-emitting chip 401b, and the third light-emitting chip 401c shown in FIG. 10E).

In some other embodiments of this application, the fingerprint collection chip 402 may be disposed only in the pixel chipset 40 of the DCU and the PU that is in the display module 01 and that is at a location at which fingerprint collection needs to be performed. Similarly, in the display module 01, the light-emitting chip 403 is disposed only in the pixel chipset 40 of the DCU and the PU at a location at which the light emitter 51 (as shown in FIG. 11) needs to be disposed. In the display module 01, the light-emitting chip 403 is disposed only in the pixel chipset 40 of the DCU and the PU at a location at which the light receiver 52 (as shown in FIG. 11) needs to be disposed.

In addition, for the bar-type display module, manners of disposing the packaging layer 71, the cover 72, the heat dissipation layer 73, and the battery 13 are the same as those described above. Details are not described herein again.

Example 2

Figure 19:
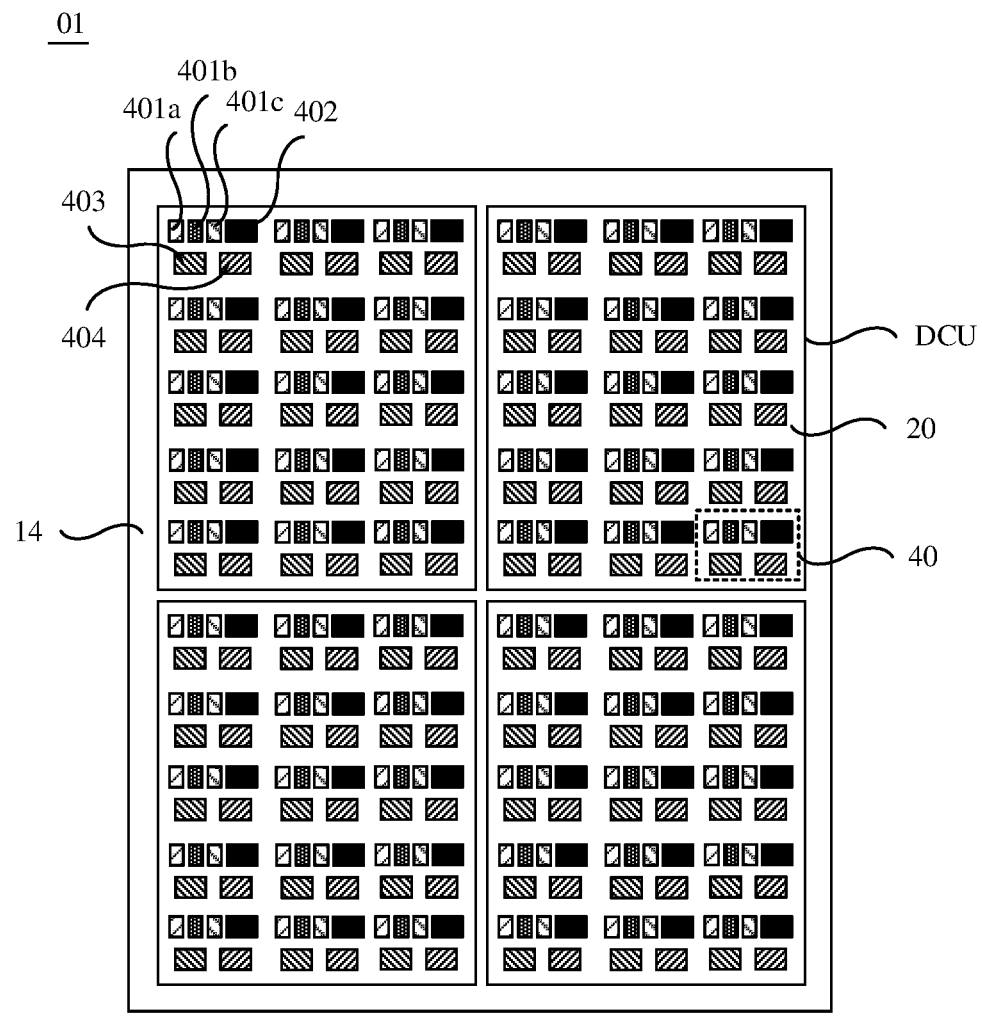
FIG. 19 is a schematic diagram of a structure of another display according to an embodiment of this application.

This example is the same as Example 1. As shown in FIG. 19, the display module 01 in the electronic device 02 includes the circuit board 14. In addition, a difference from Example 1 lies in that the display module 01 includes only the DCU. The DCU includes, as described above, the integrated chip 20 and a plurality of pixel chipsets 40 disposed on a surface of a side that is of the integrated chip 20 and that is away from the circuit board 14.

In FIG. 19, an example in which the pixel chipset 40 further includes the fingerprint collection chip 402, the light-emitting chip 403, and the light-receiving chip 404 in addition to a plurality of light-emitting chips (for example, the first light-emitting chip 401a, the second light-emitting chip 401b, and the third light-emitting chip 401c) is used. In this case, the integrated circuit 20 may include the display pixel drive circuit 100, the fingerprint pixel collection circuit 101, the light-emitting pixel drive circuit 102, and the light-receiving pixel drive circuit 103 that are integrated into the first chiplet 201. The light-emitting chip, the fingerprint collection chip 402, the light-emitting chip 403, and the light-receiving chip 404 are respectively electrically connected to the display pixel drive circuit 100, the fingerprint pixel collection circuit 101, the light-emitting pixel drive circuit 102, and the light-receiving pixel drive circuit 103 that are integrated into the first chiplet 201. A manufacturing process of the DCU and a process in which the DCU is electrically connected to the circuit board 14 are the same as those described above. Details are not described herein again.

Similarly, in some embodiments of this application, the fingerprint collection chip 402 may be disposed only in the pixel chipset 40 of the DCU that is in the display module 01 and that is at a location at which fingerprint collection needs to be performed. In the display module 01, the light-emitting chip 403 is disposed only in the pixel chipset 40 of the DCU at a location at which the light emitter 51 (as shown in FIG. 11) needs to be disposed. In the display module 01, the light-emitting chip 403 is disposed only in the pixel chipset 40 of the DCU at a location at which the light receiver 52 (as shown in FIG. 11) needs to be disposed.

In addition, in the display module 01 provided in this example, manners of disposing the packaging layer 71, the cover 72, the heat dissipation layer 73, and the battery 13 are the same as those described above. Details are not described herein again.

Example 3

Figure 20:
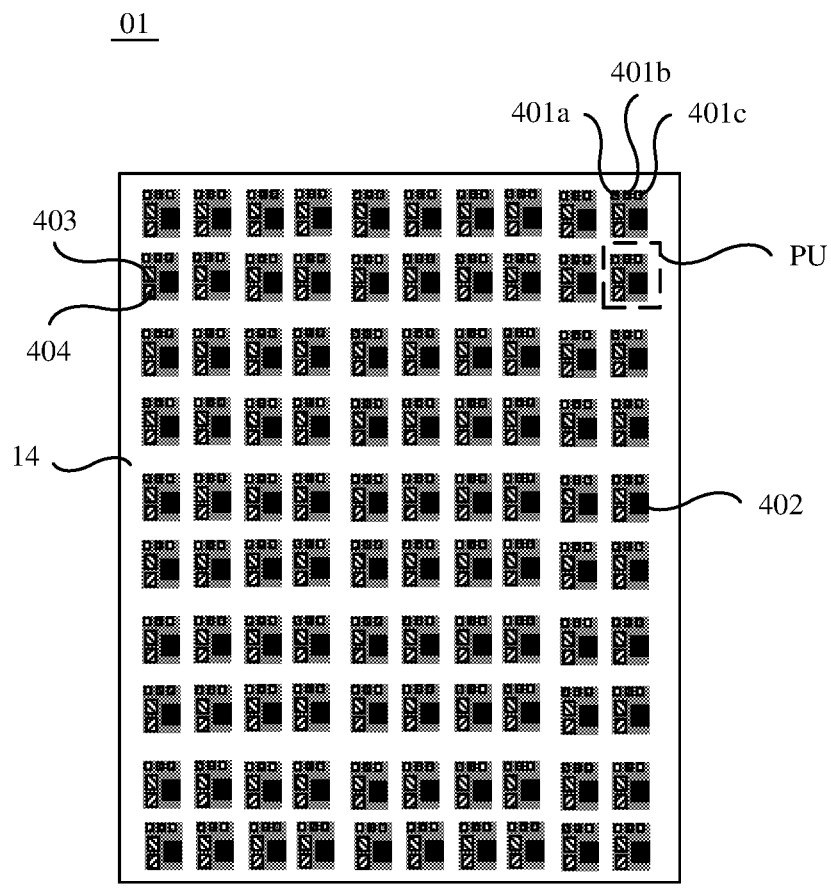
FIG. 20 is a schematic diagram of a structure of another display according to an embodiment of this application.

This example is the same as Example 1. As shown in FIG. 20, the display module 01 in the electronic device 02 includes the circuit board 14. In addition, a difference from Example 1 lies in that the display module 01 includes only the PU. The PU includes, as described above, the circuit substrate 30 and a plurality of pixel chipsets 40 disposed on a surface of a side that is of the circuit substrate 30 and that is away from the circuit board 14.

In FIG. 20, an example in which the pixel chipset 40 further includes the fingerprint collection chip 402, the light-emitting chip 403, and the light-receiving chip 404 in addition to a plurality of light-emitting chips (for example, the first light-emitting chip 401a, the second light-emitting chip 401b, and the third light-emitting chip 401c) is used. In this case, the circuit substrate 30 may include the display pixel drive circuit 100, the fingerprint pixel collection circuit 101, the light-emitting pixel drive circuit 102, and the light-receiving pixel drive circuit 103 that are integrated into the substrate body 301. The light-emitting chip, the fingerprint collection chip 402, the light-emitting chip 403, and the light-receiving chip 404 are respectively electrically connected to the display pixel drive circuit 100, the fingerprint pixel collection circuit 101, the light-emitting pixel drive circuit 102, and the light-receiving pixel drive circuit 103 that are integrated into the substrate body 301 of the circuit substrate 30. A manufacturing process of the PU and a process in which the PU is electrically connected to the circuit board 14 are the same as those described above. Details are not described herein again.

Similarly, in some embodiments of this application, the fingerprint collection chip 402 may be disposed only in the pixel chipset 40 of the PU that is in the display module 01 and that is at a location at which fingerprint collection needs to be performed. In the display module 01, the light-emitting chip 403 is disposed only in the pixel chipset 40 of the PU at a location at which the light emitter 51 (as shown in FIG. 11) needs to be disposed. In the display module 01, the light-emitting chip 403 is disposed only in the pixel chipset 40 of the PU at a location at which the light receiver 52 (as shown in FIG. 11) needs to be disposed.

Figure 21:
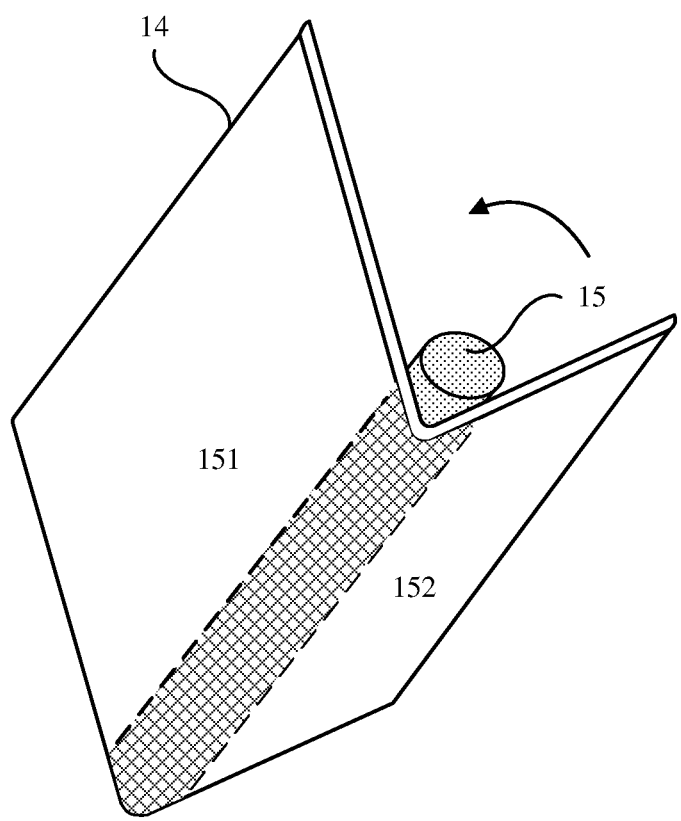
FIG. 21 is a schematic diagram of region division according to an embodiment of this application.

In addition, in this example, the circuit board 14 may be a PCB. Alternatively, the circuit board 14 may be an FPC, and the display module 01 includes the rotating shaft 15 located on a side that is of the circuit board 14 and that is away from the PU. In this case, the circuit board 14 may have a first region 151, a second region 152, and the bending region 141c located between the first region 151 and the second region 152 shown in FIG. 21. As described above, a vertical projection of the rotating shaft 15 on the circuit board 14 is located in the bending region 141c.

Figure 22:
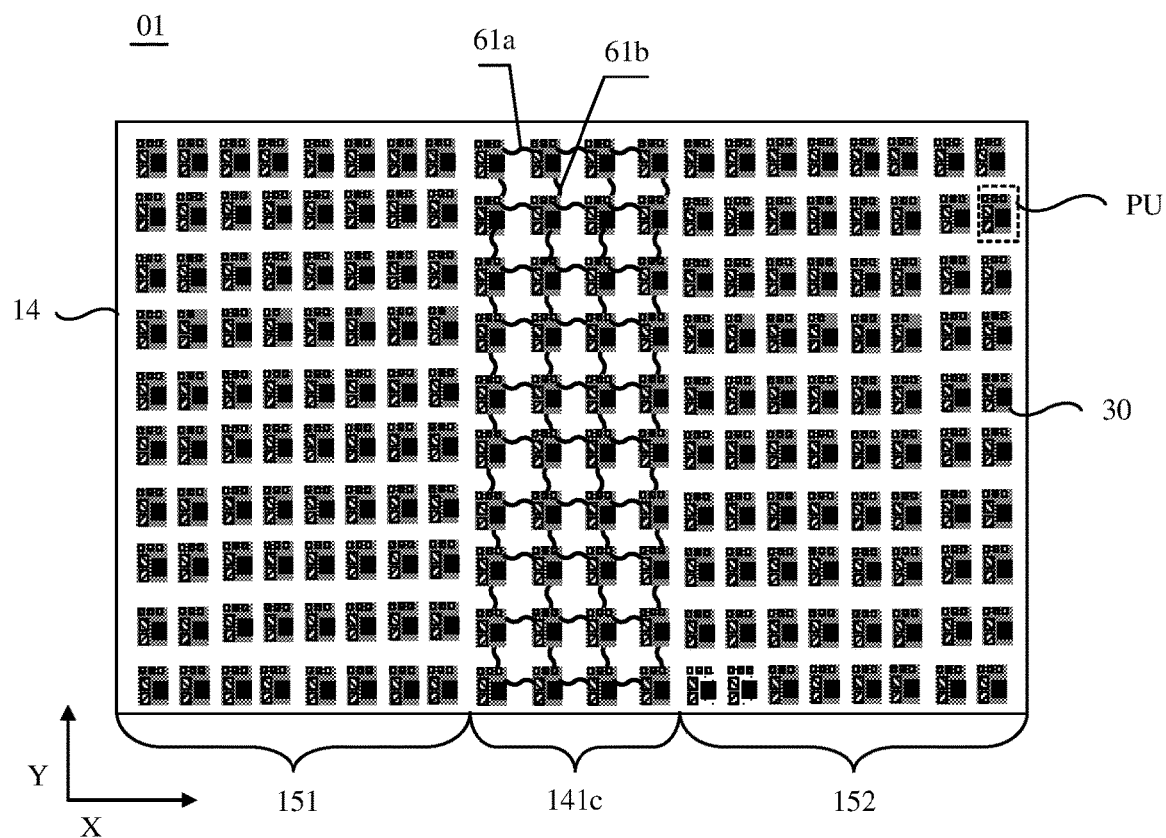
FIG. 22 is a schematic diagram of a structure of another display module according to an embodiment of this application.

Similarly, when a user folds the display module 01, the bending region 141c of the circuit board 14 is in a curved shape, and a deformation amount of the bending region 141c is greater than a deformation amount of the first surrounding region 141a and the second surrounding region 141b that deform due to a collision. Therefore, to further prevent the PU located in the bending region from cracking and improve bending reliability of the display module 01, as shown in FIG. 22, the circuit board 14 further includes a plurality of metal cables (for example, a plurality of first metal cables 61a and a plurality of second metal cables 61b) disposed in the bending region 141c. Two ends of any metal cable are respectively connected to circuit substrates 30 of two adjacent PUs. A shape and a manufacturing process of the metal cable and manners of disposing the first metal cable 61a and the second metal cable 61b are the same as those described above. Details are not described herein again.

Figure 23:
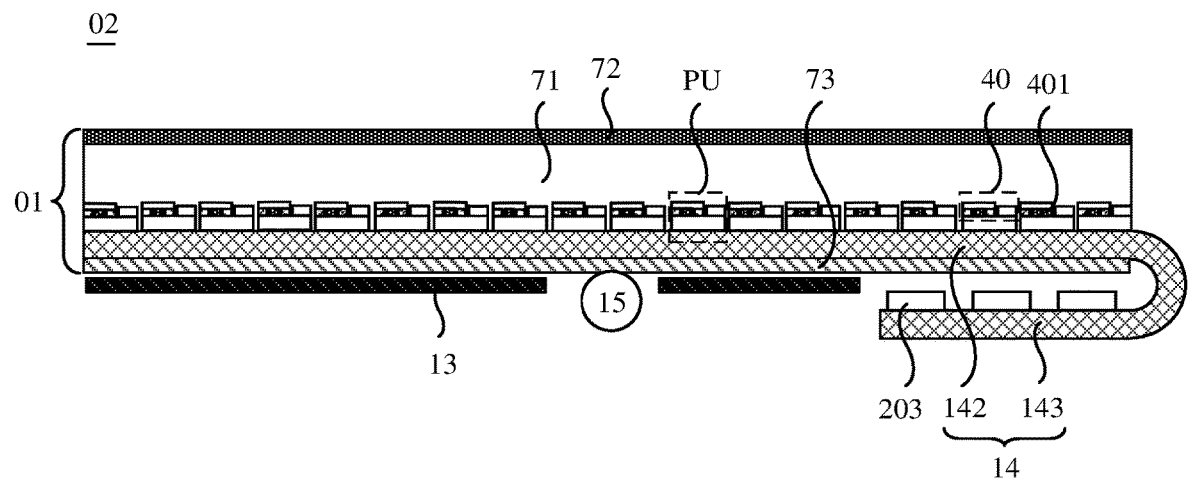
FIG. 23 is a schematic diagram of a structure of another electronic device according to an embodiment of this application.

In addition, as shown in FIG. 23, manners of disposing the packaging layer 71, the cover 72, the heat dissipation layer 73, and the battery 13 in the display module 01 provided in this example are the same as those described above. Details are not described herein again. In addition, when the circuit board 14 is an FPC, the circuit board 14 may include the first part 142 and the second part 143 connected to the first part 142. A plurality of PUs (including the circuit substrate 30 and the pixel chipset 40) are disposed in the first part 142. In addition, the second part 143 is bent on a side that is of the first part 142 and that is away from the PU. Some additional electronic components 203 in the display module 01, for example, an SoC, a PMU, a CPU, a GPU, a UFS, a DDR, or a sensor, may be disposed on a surface that is of the second part 143 and that is close to the first part 142, and are electrically connected to the circuit board 14.

The descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display module, comprising:
a circuit board;
an integrated chip, electrically connected to the circuit board, wherein the integrated chip comprises a first chiplet and a plurality of display pixel drive circuits integrated into the first chiplet;
a pixel chipset, comprising a plurality of light-emitting chips, wherein at least one pixel chipset is disposed on a surface of a side, of the integrated chip, that is away from the circuit board, wherein a light-emitting chip is disposed on the integrated chip and electrically connected to a display pixel drive circuit of the plurality of display pixel drive circuits in the integrated chip, and wherein the display pixel drive circuit is configured to drive the light-emitting chip to emit light; and
a circuit substrate, electrically connected to the circuit board, wherein two or more display pixel drive circuits of the plurality of display pixel drive circuits are integrated into the circuit substrate, and an area of a vertical projection of the circuit substrate on the circuit board is less than an area of a vertical projection of the integrated chip on the circuit board;
wherein the display module comprises two or more pixel chipsets, wherein a pixel chipset is disposed on a surface of a side of the circuit substrate away from the circuit board; and
wherein the light-emitting chip disposed on the circuit substrate is electrically connected to the display pixel drive circuit in the circuit substrate.

2. The display module according to claim 1, wherein the circuit board comprises a main view region and a surrounding region located around the main view region; and
wherein the integrated chip is disposed in the main view region, and the circuit substrate is disposed in the surrounding region.

3. The display module according to claim 1, wherein the display module further comprises a rotating shaft, the rotating shaft is disposed on a side of the circuit board is away from the integrated chip, the circuit board is a flexible circuit board, and wherein the circuit board comprises a first main view region, a second main view region, a first surrounding region, a second surrounding region, and a bending region;
wherein the bending region is located between the first main view region and the second main view region, a vertical projection of the rotating shaft on the circuit board is located in the bending region, the first surrounding region is disposed around the first main view region, and the second surrounding region is disposed around the second main view region; and
wherein the integrated chip is disposed in the first main view region and the second main view region, and wherein the circuit substrate is disposed in the bending region, the first surrounding region, and the second surrounding region.

4. The display module according to claim 3, wherein the circuit board comprises a plurality of metal cables, the plurality of metal cables are disposed in the bending region, the metal cable is in a curved shape, and two ends of the metal cable are respectively connected to two circuit substrates.

5. The display module according to claim 4, wherein a plurality of circuit substrates in the bending region are arranged in a matrix form; and
the plurality of metal cables comprise a plurality of first metal cables and a plurality of second metal cables, each first metal cable of the plurality of first metal cables is connected to two adjacent circuit substrates along a first direction, and each second metal cable of the plurality of second metal cables is connected to two adjacent circuit substrates along a second direction, wherein the first direction is perpendicular to the second direction.

6. The display module according to claim 1, wherein the plurality of light-emitting chips in the same pixel chipset comprise a first light-emitting chip, a second light-emitting chip, and a third light-emitting chip; and
wherein the first light-emitting chip, the second light-emitting chip, and the third light-emitting chip are respectively configured to emit light of three primary colors.

7. The display module according to claim 1, wherein the integrated chip further comprises a plurality of fingerprint pixel collection circuits integrated into the first chiplet; and
wherein the pixel chipset further comprises a fingerprint collection chip, wherein the fingerprint collection chip is disposed on the integrated chip and electrically connected to a fingerprint pixel collection circuit in the integrated chip, the fingerprint pixel collection circuit is configured to drive the fingerprint collection chip to perform fingerprint collection, and a plurality of fingerprint collection chips in different pixel chipsets form a fingerprint collector.

8. The display module according to claim 1, wherein the integrated chip further comprises a plurality of fingerprint pixel collection circuits integrated into the first chiplet, and the plurality of fingerprint pixel collection circuits are further integrated into the circuit substrate; and
the pixel chipset further comprises a fingerprint collection chip, wherein the fingerprint collection chip is disposed on the integrated chip and electrically connected to a fingerprint pixel collection circuit in the integrated chip, the fingerprint collection chip disposed on the circuit substrate is electrically connected to the fingerprint pixel collection circuit in the circuit substrate, the fingerprint pixel collection circuit is configured to drive the fingerprint collection chip to perform fingerprint collection, and a plurality of fingerprint collection chips in different pixel chipsets form a fingerprint collector.

9. The display module according to claim 1, wherein the integrated chip further comprises a plurality of light-transmitting pixel drive circuits and a plurality of light-receiving pixel drive circuits integrated into the first chiplet;
wherein the pixel chipset further comprises the light-emitting chip and a light-receiving chip, wherein the light-emitting chip is disposed on the integrated chip and electrically connected to a light-emitting pixel drive circuit in the integrated chip, the light-receiving chip is electrically connected to a light-receiving pixel drive circuit in the integrated chip, the light-emitting pixel drive circuit is configured to drive the light-emitting chip to emit light, and the light-receiving pixel drive circuit is configured to drive the light-receiving chip to receive light; and
wherein a plurality of light-emitting chips in different pixel chipsets form a light emitter, and a plurality of light-receiving chips in different pixel chipsets form a light receiver.

10. The display module according to claim 1, wherein the integrated chip further comprises a plurality of light-emitting pixel drive circuits and a plurality of light-receiving pixel drive circuits integrated into the first chiplet, and wherein a light-emitting pixel drive circuit and a light-receiving pixel drive circuit are further integrated into the circuit substrate;

wherein the pixel chipset further comprises a light-emitting chip and a light-receiving chip, wherein the light-emitting chip is electrically connected to a light-emitting pixel drive circuit in the integrated chip, the light-receiving chip is electrically connected to a light-receiving pixel drive circuit of the plurality of light receiving drive circuits in the integrated chip;

wherein a light-receiving chip is electrically connected to a light-receiving pixel drive circuit in the circuit substrate;

wherein the light-emitting pixel drive circuit is configured to drive the light-emitting chip to emit light, and the light-receiving pixel drive circuit is configured to drive the light-receiving chip to receive light; and wherein a plurality of light-emitting chips in different pixel chipsets form a light emitter, and a plurality of light-receiving chips in different pixel chipsets form a light receiver.

11. The display module according to claim 1, wherein the integrated chip further comprises a second chiplet;

wherein the second chiplet and the first chiplet are disposed in a stacked manner, and the second chiplet is located on a side of the first chiplet close to the circuit board; and wherein the second chiplet comprises a system-on-a-chip, a power management unit, a central processing unit, or an image processor, and wherein the first chiplet comprises a storage chip.

12. The display module according to claim 1, wherein the circuit board is a flexible circuit board;

wherein the circuit board comprises a first part and a second part connected to the first part, a vertical projection of the pixel chipset on the circuit board is located in the first part, and the second part is bent on a side that is of the first part and that is away from the pixel chipset; and wherein the display module further comprises an additional electronic component disposed on a surface of the second part and close to the first part, and electrically connected to the circuit board.

13. The display module according to claim 1, wherein the display module further comprises an interposer electrically connected to the circuit board, and wherein at least two integrated chips are disposed on a surface of a side of the interposer away from the circuit board, and wherein the at least two integrated chips are electrically connected through the interposer.

14. An electronic device, comprising:

a battery; and a display module, comprising:

a circuit board;

an integrated chip, electrically connected to the circuit board, wherein the integrated chip comprises a first chiplet and a plurality of display pixel drive circuits integrated into the first chiplet;

a pixel chipset, comprising a plurality of light-emitting chips, wherein at least one pixel chipset is disposed on a surface of a side, of the integrated chip, that is away from the circuit board, wherein a light-emitting chip is disposed on the integrated chip and electrically connected to a display pixel drive circuit of the plurality of display pixel drive circuits in the integrated chip, and wherein the display pixel drive circuit is configured to drive the light-emitting chip to emit light; and a circuit substrate, electrically connected to the circuit board, wherein two or more display pixel drive circuits of the plurality of display pixel drive circuits are integrated into the circuit substrate, and an area of a vertical projection of the circuit substrate on the circuit board is less than an area of a vertical projection of the integrated chip on the circuit board;

wherein the display module comprises two or more pixel chipsets, wherein a pixel chipset is disposed on a surface of a side of the circuit substrate away from the circuit board;

wherein the light-emitting chip disposed on the circuit substrate is electrically connected to the display pixel drive circuit in the circuit substrate; and wherein the battery is located on a side of the circuit board away from the pixel chipset.

15. A display module, comprising:

a circuit board;

a circuit substrate, electrically connected to the circuit board, wherein a plurality of display pixel drive circuits are integrated into the circuit substrate, and wherein a fingerprint pixel collection circuit is further integrated into the circuit substrate; and a pixel chipset, comprising a plurality of light-emitting chips, wherein the pixel chipset is disposed on a surface of a side, of the circuit substrate, that is away from the circuit board;

wherein a light-emitting chip of the plurality of light-emitting chips is disposed on the circuit substrate and electrically connected to a display pixel drive circuit of the plurality of display pixel drive circuits in the circuit substrate, and wherein a display pixel drive circuit is configured to drive the light-emitting chip to emit light; and wherein the pixel chipset further comprises a fingerprint collection chip, wherein a fingerprint collection chip is disposed on the circuit substrate and electrically connected to the fingerprint pixel collection circuit in the circuit substrate, the fingerprint pixel collection circuit is configured to drive the fingerprint collection chip to perform fingerprint collection, and a plurality of fingerprint collection chips in different pixel chipsets form a fingerprint collector.

16. The display module according to claim 15, wherein the display module further comprises a rotating shaft, the rotating shaft is disposed on a side of the circuit board away from the circuit substrate, and the circuit board is a flexible circuit board;

wherein the circuit board comprises a first region, a second region, and a bending region located between the first region and the second region;

wherein a vertical projection of the rotating shaft on the flexible circuit board is located in the bending region; and wherein the circuit board comprises a plurality of metal cables, the plurality of metal cables are disposed in the bending region, the a metal cable of the plurality of metal cables is in a curved shape, and two ends of a metal cable of the plurality of metal cables are respectively connected to two circuit substrates.

17. The display module according to claim 16, wherein a plurality of circuit substrates in the bending region are arranged in a matrix form; and wherein the plurality of metal cables comprise a plurality of first metal cables and a plurality of second metal cables, each first metal cable of the plurality of first metal cables is connected to two adjacent circuit substrates along a first direction, and each second metal cable of the plurality of second metal cables is connected to two adjacent circuit substrates along a second direction, wherein the first direction is perpendicular to the second direction.

18. The display module according to claim 15, wherein the plurality of light-emitting chips in the same pixel chipset comprise a first light-emitting chip, a second light-emitting chip, and a third light-emitting chip; and wherein the first light-emitting chip, the second light-emitting chip, and the third light-emitting chip are respectively configured to emit light of three primary colors.

\* \* \* \* \*